(12) United States Patent
Tsukamoto et al.

(10) Patent No.: US 7,584,535 B2
(45) Date of Patent: Sep. 8, 2009

(54) METHOD OF MANUFACTURING MULTI-LAYER WIRING BOARD

(75) Inventors: Takehito Tsukamoto, Tokyo (JP); Hiroshi Matsuzawa, Tokyo (JP); Satoshi Akimoto, Tokyo (JP); Masataka Maehara, Tokyo (JP); Takumi Suemoto, Tokyo (JP); Masayuki Ode, Tokyo (JP); Yuichi Sakaki, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 11/727,630

(22) Filed: Mar. 27, 2007

(65) Prior Publication Data

US 2007/0175025 A1    Aug. 2, 2007

Related U.S. Application Data

(60) Division of application No. 10/808,502, filed on Mar. 25, 2004, now abandoned, and a continuation of application No. PCT/JP02/10172, filed on Sep. 30, 2002.

(30) Foreign Application Priority Data

Sep. 28, 2001    (JP) .............................. 2001-304651

(51) Int. Cl.
*H05K 3/36* (2006.01)
(52) U.S. Cl. .............................. 29/830; 29/831; 29/846; 29/852
(58) Field of Classification Search ............... 29/830, 29/831, 846, 852
See application file for complete search history.

(56) References Cited

U.S. PATENT DOCUMENTS

| 5,214,571 | A | * | 5/1993 | Dahlgren et al. ............. 361/795 |
| 5,346,117 | A | * | 9/1994 | Kohn et al. ............. 228/180.22 |
| 5,436,062 | A | | 7/1995 | Schmidt et al. |
| 5,601,678 | A | * | 2/1997 | Gerber et al. ............... 156/150 |
| 5,738,931 | A | | 4/1998 | Sato et al. |
| 5,798,563 | A | | 8/1998 | Feilchenfeld et al. |
| 5,965,043 | A | * | 10/1999 | Noddin et al. ......... 219/121.71 |
| 5,976,391 | A | * | 11/1999 | Belke et al. .................... 216/13 |
| 6,039,889 | A | | 3/2000 | Zhang et al. |
| 6,165,957 | A | * | 12/2000 | Vitomir ...................... 510/203 |

(Continued)

FOREIGN PATENT DOCUMENTS

CN    1282203    1/2001

(Continued)

OTHER PUBLICATIONS

Japanese Office Action for corresponding Japanese Patent Application No. 2003-533655 dated Aug. 12, 2008 (pp. 1-4).

(Continued)

*Primary Examiner*—C. J. Arbes

(57) ABSTRACT

A method of manufacturing a multi-layer circuit wiring board, including simultaneously laminating a second flexible resin film on one surface of a first flexible resin film having a first wiring pattern on at least one surface thereof, and a third wiring pattern on another surface of the first flexible resin film, the second flexible resin film having a second wiring pattern formed on at least one surface thereof, and the third flexible resin film having a third wiring pattern formed on at least one surface thereof.

17 Claims, 16 Drawing Sheets

U.S. PATENT DOCUMENTS

| | | |
|---|---|---|
| 6,228,467 B1 | 5/2001 | Taniguchi et al. |
| 6,351,031 B1 | 2/2002 | Iijima et al. |
| 6,630,630 B1 | 10/2003 | Maezawa et al. |
| 6,734,369 B1 | 5/2004 | Bailey et al. |
| 6,797,367 B2 | 9/2004 | Ogawa et al. |
| 6,797,890 B2 | 9/2004 | Okubora et al. |
| 2002/0079288 A1* | 6/2002 | Andresakis et al. .......... 216/13 |
| 2002/0134582 A1 | 9/2002 | Celaya et al. |

FOREIGN PATENT DOCUMENTS

| | | |
|---|---|---|
| JP | 4-148590 | 5/1992 |
| JP | 05-243730 | 9/1993 |
| JP | 7-500951 | 1/1995 |
| JP | 10-308493 | 11/1998 |
| JP | 11-266082 | 9/1999 |
| JP | 2001-085567 | 3/2001 |
| JP | 2001-85567 | 3/2001 |
| JP | 2001-102720 | 4/2001 |
| JP | 2001-185653 | 7/2001 |

OTHER PUBLICATIONS

Chinese Office Action for corresponding Chinese Patent Application No. 028188918 dated Aug. 3, 2007.

Chinese Office Action for corresponding Chinese Patent Application No. 028188918 dated Feb. 15, 2008 (7 pgs).

* cited by examiner

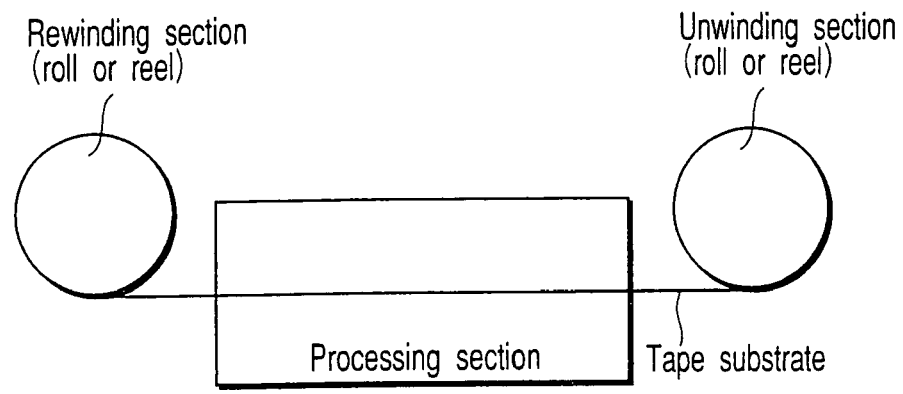
F I G. 7
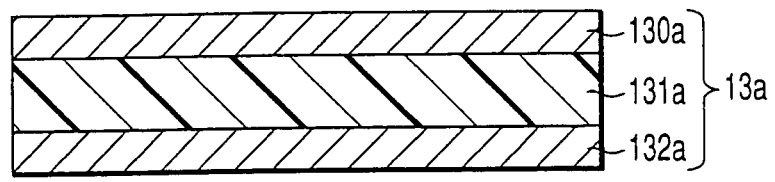
F I G. 8A
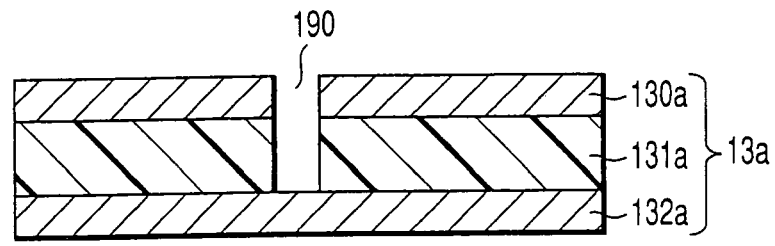
F I G. 8B
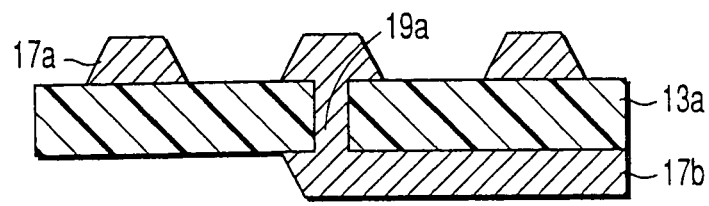
F I G. 8C

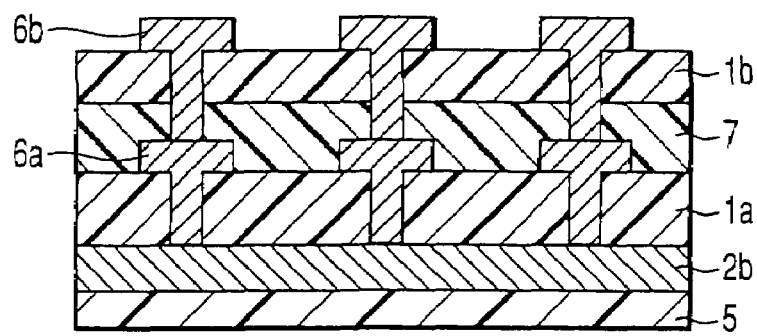
F I G. 14H
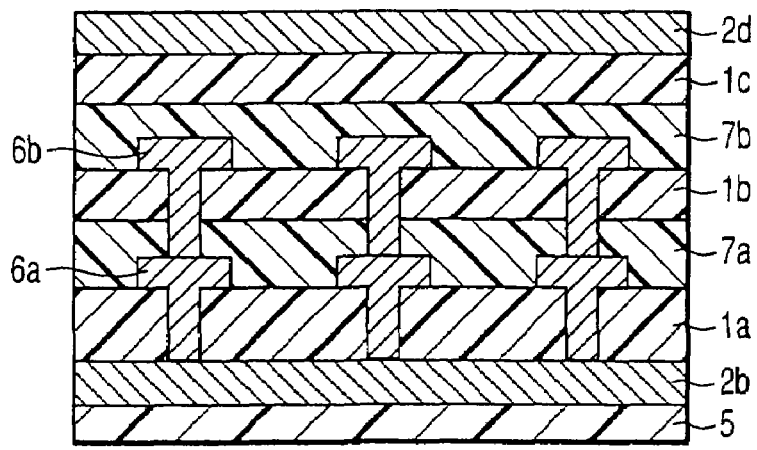
F I G. 14I
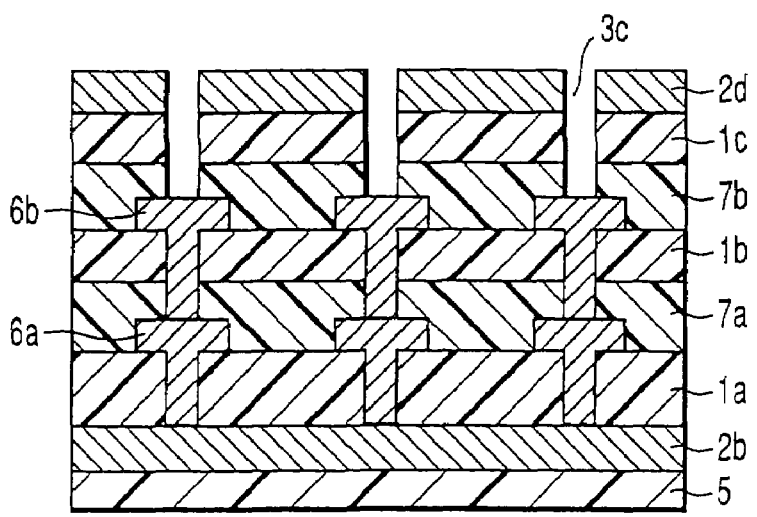
F I G. 14J

METHOD OF MANUFACTURING MULTI-LAYER WIRING BOARD

CROSS-REFERENCE TO RELATED APPLICATIONS

This application is a divisional of U.S. patent application Ser. No. 10/808,502, filed Mar. 25, 2004, now abadoned. U.S. patent application Ser. No. 10/808,502, is a Continuation Application of PCT Application No. PCT/JP02/10172, filed Sep. 30, 2002, which was not published under PCT Article 21(2) in English, which in turn claims the benefit of priority from prior Japanese Patent Application No. 2001-304651, filed Sep. 28, 2001. This application claims priority of all of the foregoing applications, the entire contents of which are incorporated herein by reference.

BACKGROUND OF THE INVENTION

1. Field of the Invention

The present invention relates to a multi-layer wiring board, to a semiconductor package, and to a method of manufacturing the multi-layer wiring board.

2. Description of the Related Art

In recent years, there has been developed, as a semiconductor device such a semiconductor large scale integrated circuit (LSI), one whose operating speed is increased up to 1 GHz in terms of clock frequency. In such a high-speed semiconductor device, the integration degree of transistors is fairly high, so that the number of input/output terminals may in sometimes exceed over 1,000.

In order to mount such a multi-terminal semiconductor device on a printed wiring board, there have been developed various kinds of techniques. The techniques which are currently widely put into practical use include an interposer such as BGA (Ball Grid Array) and CSP (Chip Size Package).

FIG. 1 illustrates one example of an IC package wherein a semiconductor device is mounted on an interposer of BGA structure and packaged in a printed wiring board.

Referring to FIG. 1, a multi-layer circuit wiring board 53 comprises a copper-clad substrate (glass epoxy substrate) 530 made from glass cloth into which epoxy resin is impregnated, a first layer 531 formed of a laminate comprising insulating layers and conductive wiring layers, which are alternately superimposed, and a second layer 532 formed of a laminate also comprising insulating layers and conductive wiring layers, which are alternately superimposed. The first layer 531 is placed on one of the main surfaces of the glass epoxy substrate 530, and the second layer 532 is placed on the other main surface of the glass epoxy substrate 530.

The first layer 531 is provided on the top surface thereof with surface-treated gold pads 536, and with gold bumps 537 for bringing into contact with the electrodes (not shown) of a semiconductor device 54. Further, the second layer 532 is provided on the bottom surface thereof with surface-treated gold pads 538 for bringing into contact, through a solder ball 52, with a conductive wiring layer 511 of a printed wiring board 51. A pad 536 is electrically connected with a pad 538 by way of via-contact conductor layers 533 and 535.

A method of forming a multi-layer circuit wiring board by successively piling up insulating resin layers and conductive wiring layers one upon another on a glass epoxy substrate as described above is called a build-up technique. Details of this technique are described for example in Japanese Laid-open Patent Publication (Kokai) No. 4-148590 (1992).

In this technique, it is no longer required to employ a core material such as glass cloth which has been conventionally employed as an insulating layer of a multi-layer circuit wiring board and laminated together with a wiring layer. Namely, the insulating layer of the multi-layer circuit wiring board is formed in this technique by a method wherein a photosensitive resin composition is coated on a surface of glass epoxy substrate and then cured to form the insulating layer. On the other hand, the wiring pattern of the multi-layer circuit wiring board according to the aforementioned build-up technique is formed by making use of a plating method in contrast to that of the conventional multi-layer circuit wiring board. Therefore, it is possible, according to the aforementioned build-up technique, to form a finer wiring pattern in the multi-layer circuit wiring board as compared with the wiring pattern of the conventional multi-layer circuit wiring board. For example, it is possible to form a wiring pattern 50 µm in line width and about 50 µm in width of space between lines.

The via-contact layer 535 for bringing into contact with both of upper and lower conductive wiring layers can be formed by a method wherein a fine hole is formed in the layer by means of photolithography by taking advantage of the photosensitivity of a resin composition, and then the hole is filled with a conductive material by means of plating. In the case of the conventional multi-layer circuit wiring board where all of the layers are collectively laminated, the diameter of the through-hole cannot be made smaller than 300 µm. Whereas, according to the aforementioned build-up technique, the diameter of the through-hole can be made as small as 100 µm or so, thereby making it possible to enhance the density of the through-holes.

However, the structure of the conventional multi-layer circuit wiring board is accompanied with the following problems in enhancing the density of wirings, in increasing the transmitting speed of signals, and in promoting the mass production thereof.

First, the conductive wiring layer according to the build-up technique is formed at first by way of electroless plating on an insulating resin layer, which is followed by electrolytic plating. Generally, the adhesive strength of the electroless-plated layer to the insulating resin layer is relatively low. Therefore, the surface of the insulating resin layer is roughened prior to the electroless plating to have a surface roughness 5 µm to 10 µm in maximum height, thereby promoting the anchoring effect and hence enhancing the adhesive strength of the electroless-plated layer. Due to this surface roughness however, non-uniformity in lateral direction is caused to generate on the occasion of forming a wiring pattern by an etching method, etc., thereby making it impossible to obtain a wiring pattern excellent in linearity. In a wiring pattern where the line width thereof is 50 µm or less, this non-uniformity cannot be disregarded. Namely, noise due to reflection may become enlarged on the occasion of passing signals at a high speed, thus raising a problem. Therefore, according to the conventional build-up technique, it is difficult to manufacture a multi-layer circuit wiring board which is high in density of wiring pattern and capable of transmitting signals at a high speed, or more specifically, a multi-layer circuit wiring board having a fine wiring pattern 50 µm or less in line-and-space, and hence to manufacture an IC package having such features.

Secondly, since the glass epoxy substrate is poor in flexibility, it is impossible to adopt a roll-to-roll technique which is designed to continuously manufacture a multi-layer circuit wiring board by making use of a long strip of base material, and hence it is difficult to apply a mass-production method to the manufacture of the conventional multi-layer circuit wiring board.

Thirdly, as described above, as a semiconductor device is designed so as to further increase the processing speed thereof, the number of input/output terminals of the semiconductor device is also required to be proportionally increased. Under such circumstances, the conventional wire bonding method is no longer capable of performing the electrical connection between such an increased number of terminals and the interposers. On the other hand, the wirings extending from the connecting terminals which are provided within the interposer can be hardly dealt with by a single layer and hence may be required to be separated so as to arrange them in at least two layers. Further, in order to cope with the speedup of signals, it may be required to adopt a microstrip structure of wirings, a strip structure of wirings, or the multiplication of wirings such as a coplanar structure.

However, as far as the manufacturer of the interposer is concerned, any increase in number of wiring layers leads to a substantial reduction of yield. Therefore, it is very important to consider how to effectively arrange the wirings, and how to design the wirings in order to minimize the number of wiring layers. There are increasing demands for the development of a multi-layer circuit wiring board and an IC package where the wirings thereof are constituted by a wiring pattern of finer line-and-space in order to realize an effective arrangement of wirings.

Fourthly, as described above, in the multi-layer circuit wiring board to be according to the build-up technique, a substrate (glass epoxy substrate) manufactured by means of the conventional method is employed as a core layer of the wiring board. In order to electrically connect the upper side of the substrate with the underside thereof, a through-hole is formed by making use of a drill, and plating is applied to the inner wall of the through-hole to thereby obtain a plated through-hole. In this case, since the through-hole is mechanically formed by making use of a drill, the miniaturization in size of the through-hole would be considerably restricted. Likewise, for the same reason, the minimization in pitch of the through-holes would be considerably restricted. For example, at present, a typical value of the diameter of the through-hole is 300 μm, and a typical value of the pitch of the through-holes is 800 μm.

As described above, since the miniaturization in size of the through-hole as well as the minimization in pitch of the through-holes are restricted, there is a problem in the prior art that the density of BGA ball pin cannot be enhanced. As a result, any increase in the number of input/output terminals in a semiconductor device would inevitably lead to an increase in size of the body of the interposer, resulting in the elongation in length of the wirings and hence in the delay of signals.

Additionally, since the pitch of the through-holes in the core layer is relatively large, a high density fine wiring is formed only on one of the build-up layers which is designed to mount semiconductor devices. Whereas, the other build-up layer which is disposed on the opposite surface of the core layer and designed to mount balls is frequently employed solely for preventing the warpage of the wiring board. As a result, the number of layers is caused to increase more than needed, which leads to an increase in manufacturing cost of the wiring board.

Further, since the glass epoxy substrate to be employed as the core layer is generally made of a glass cloth, the thickness of the core layer becomes relatively large, thus substantially increasing the total thickness of the interposer. If the total thickness of the interposer is increased in this manner, it becomes difficult to align the characteristic impedance of the wirings formed in board-thickness direction, i.e. the through-hole and via-contact layer, thus making it disadvantageous in enhancing the operating speed of semiconductor device.

The present invention has been accomplished in view of overcoming the aforementioned problems, and therefore, the objects of the present invention are to provide a method of manufacturing a multi-layer circuit wiring board, which is capable of forming a wiring pattern having a fine line-and-space, and of adopting a roll-to-roll technique where a long strip of base material is employed to continuously manufacture a multi-layer circuit wiring board.

SUMMARY OF THE INVENTION

Additional aspects and/or advantages of the invention will be set forth in part in the description which follows and, in part, will be apparent from the description, or may be learned by practice of the invention.

According to a first aspect of the present invention, there is provided a multi-layer circuit wiring board comprising a laminate of films, each film having a wiring pattern formed on at least one surface thereof, wherein the wiring pattern formed on each film is electrically connected with the wiring pattern formed on another film which is disposed neighboring thereto through a via-contact layer formed in any one of the neighboring films.

According to a second aspect of the present invention, there is provided a multi-layer circuit wiring board comprising: a first film having a first wiring pattern formed on one surface thereof, a second wiring pattern formed on another surface thereof, and a first via-contact layer electrically connecting the first wiring pattern with the second wiring pattern; a second film provided with a third wiring pattern for mounting an IC on one surface thereof, another surface thereof being superimposed on the one surface of the first film; a third film provided on one surface thereof with a fourth wiring pattern to be electrically connected with a printed wiring board, another surface thereof being superimposed on the other surface of the first film; a second via-contact layer for electrically connecting the first wiring pattern with the third wiring pattern; and a third via-contact layer for electrically connecting the second wiring pattern with the fourth wiring pattern.

According to a third aspect of the present invention, there is provided a multi-layer circuit wiring board comprising: a first film having a first wiring pattern formed on one surface thereof; and a second film provided with a third wiring pattern for mounting an IC on one surface thereof, another surface thereof being superimposed on the one surface of the first film; wherein the second film is provided with a first via-contact layer for electrically connecting the first wiring pattern with the third wiring pattern.

According to a fourth aspect of the present invention, there is provided a multi-layer circuit wiring board comprising: a first film having a first wiring pattern formed on one surface thereof, a second wiring pattern formed on another surface thereof, and a first via-contact layer electrically connecting the first wiring pattern with the second wiring pattern; a second film provided with a third wiring pattern on one surface thereof, another surface thereof being superimposed on the one surface of the first film; a third film provided with a fourth wiring pattern on one surface thereof, another surface thereof being superimposed on the other surface of the first film; a second via-contact layer for electrically connecting the first wiring pattern with the third wiring pattern; a third via-contact layer for electrically connecting the second wiring pattern with the fourth wiring pattern; a fourth film provided with a fifth wiring pattern for mounting an IC on one surface thereof, another surface thereof being superimposed on the second film; a fifth film provided on one surface thereof with a sixth wiring pattern to be electrically connected with a printed wiring board, another surface thereof being superimposed on the third film; a fourth via-contact layer for electrically connecting the third wiring pattern with the fifth wiring pattern; and a fifth via-contact layer for electrically connecting the fourth wiring pattern with the sixth wiring pattern.

According to a fifth aspect of the present invention, there is provided a multi-layer circuit wiring board comprising a laminate of resin films, each resin film having a wiring pattern formed on at least one surface thereof, wherein the wiring pattern formed on one resin film is electrically connected with a wiring pattern formed on another resin film which is disposed next to the one resin film, through a via-contact layer provided on the one resin film or on the another resin film, a wiring pattern formed on an outermost resin film on one side of the laminate is a wiring pattern for mounting an IC, and a wiring pattern formed on another outermost resin film on another side of the laminate is a wiring pattern to be electrically connected with a printed wiring board.

According to a sixth aspect of the present invention, there is provided an IC package comprising an IC, and a multi-layer circuit wiring board mounting the IC, wherein the multi-layer circuit wiring board comprising: a first film having a first wiring pattern formed on one surface thereof, a second wiring pattern formed on another surface thereof, and a first via-contact layer electrically connecting the first wiring pattern with the second wiring pattern; a second film provided with a third wiring pattern for mounting an IC on one surface thereof, another surface thereof being superimposed on the one surface of the first film; a third film provided on one surface thereof with a fourth wiring pattern to be electrically connected with a printed wiring board, another surface thereof being superimposed on the other surface of the first film; a second via-contact layer for electrically connecting the first wiring pattern with the third wiring pattern; and a third via-contact layer for electrically connecting the second wiring pattern with the fourth wiring pattern.

According to a seventh aspect of the present invention, there is provided an IC package comprising an IC, a multi-layer circuit wiring board mounting the IC, and a printed wiring board mounting the multi-layer circuit wiring board, wherein the multi-layer circuit wiring board comprising: a first film having a first wiring pattern formed on one surface thereof, a second wiring pattern formed on another surface thereof, and a first via-contact layer electrically connecting the first wiring pattern with the second wiring pattern; a second film provided with a third wiring pattern for mounting an IC on one surface thereof, another surface thereof being superimposed on the one surface of the first film; a third film provided on one surface thereof with a fourth wiring pattern to be electrically connected with a printed wiring board, another surface thereof being superimposed on the other surface of the first film; a second via-contact layer for electrically connecting the first wiring pattern with the third wiring pattern; and a third via-contact layer for electrically connecting the second wiring pattern with the fourth wiring pattern.

According to an eighth aspect of the present invention, there is provided a method of manufacturing a multi-layer circuit wiring board, the method comprising: forming a first via-contact layer in a first film having a first conductor layer formed on one surface thereof, and a second conductor layer formed on another surface thereof, thereby electrically connecting the first conductor layer with the second conductor layer; forming a first wiring pattern in the first conductor layer, and forming a second wiring pattern in the second conductor layer; laminating a second film having a first insulating layer and a third conductor layer formed on the first insulating layer on the one surface of the first film in such a manner that the first insulating layer is in contact with the one surface of the first film; laminating a third film having a second insulating layer and a fourth conductor layer formed on the second insulating layer on the other surface of the first film in such a manner that the second insulating layer is in contact with the other surface of the first film; forming a second via-contact layer electrically connecting the third conductor layer with the first wiring pattern, and forming a third via-contact layer electrically connecting the fourth conductor layer with the second wiring pattern; forming a wiring pattern for mounting an IC on the first conductor layer; and forming a wiring pattern to be electrically connected with a printed wiring board on the second conductor layer.

According to a ninth aspect of the present invention, there is provided a method of manufacturing a multi-layer circuit wiring board, the method comprising: forming a first via-contact layer in a first film having a first conductor layer formed on one surface thereof, and a second conductor layer formed on the other surface thereof, thereby electrically connecting the first conductor layer with the second conductor layer; forming a first wiring pattern in the first conductor layer; forming a second wiring pattern in the second conductor layer; laminating a second film having a first insulating layer and a third conductor layer formed on the first insulating layer on the one surface of the first film in such a manner that the first insulating layer is brought into contact with the one surface of the first film; laminating a third film having a second insulating layer and a fourth conductor layer formed on the second insulating layer on the other surface of the first film in such a manner that the second insulating layer is brought into contact with the other surface of the first film; forming a second via-contact layer electrically connecting the third conductor layer with the first wiring pattern; forming a third via-contact layer electrically connecting the fourth conductor layer with the second wiring pattern; forming a predetermined wiring pattern respectively in the third conductor layer and in the fourth conductor layer; laminating a fourth film over the wiring pattern of the third conductor layer, the fourth film having a third insulating layer and a fifth conductor layer formed on the third insulating layer; laminating a fifth film over the wiring pattern of the second conductor layer, the fifth film having a fourth insulating layer and a sixth conductor layer formed on the fourth insulating layer; forming a fourth via-contact layer electrically connecting the wiring pattern of the third conductor layer with the fifth conductor layer; forming a fifth via-contact layer electrically connecting the wiring pattern of the fourth conductor layer with the sixth conductor layer; forming a wiring pattern for mounting an IC on the third conductor layer; and forming a wiring pattern to be electrically connected with a printed wiring board on the fourth conductor layer.

According to a tenth aspect of the present invention, there is provided a method of manufacturing a multi-layer circuit wiring board, the method comprising: (a) forming a first via-contact layer in a first film having a first conductor layer formed on one surface thereof, and a second conductor layer formed on the other surface thereof, thereby electrically connecting the first conductor layer with the second conductor layer; (b) forming a first wiring pattern in the first conductor layer, and forming a second wiring pattern in the second conductor layer; (c) laminating a second film having a first insulating layer and a third conductor layer formed on the first insulating layer on the one surface of the first film in such a manner that the first insulating layer is brought into contact with the one surface of the first film; (d) laminating a third film having a second insulating layer and a fourth conductor layer formed on the second insulating layer on the other surface of the first film in such a manner that the second insulating layer is brought into contact with the other surface of the first film; (e) forming a second via-contact layer electrically connecting the third conductor layer with the first wiring pattern, and forming a third via-contact layer electrically connecting the fourth conductor layer with the second wiring pattern; (f) forming a predetermined wiring pattern respectively in the third conductor layer and in the fourth conductor layer; (g) laminating a fourth film over the wiring pattern of the third conductor layer, the fourth film having a third insulating layer and a fifth conductor layer formed on the third insulating layer; (h) laminating a fifth film over the wiring pattern of the second conductor layer, the fifth film having a fourth insulating layer and a sixth conductor layer formed on the fourth insulating layer; (i) forming a fourth via-contact layer electrically connecting the wiring pattern of the third conductor layer with the fifth conductor layer, and forming a fifth via-contact layer electrically connecting the wiring pattern of the fourth conductor layer with the sixth conductor layer; repeating the steps (g) through (i) to thereby form a required number of layers to form a laminate; forming a wiring pattern for mounting an IC on an outermost conductor layer which is disposed on one surface of the laminate; and forming a wiring pattern to be electrically connected with a printed wiring board on another outermost conductor layer which is disposed on the other surface of the laminate.

According to an eleventh aspect of the present invention, there is provided a method of manufacturing a multi-layer circuit wiring board, the method comprising: forming a first via-contact layer in a first film having a first conductor layer formed on one surface thereof, and a second conductor layer formed on the other surface thereof, thereby electrically connecting the first conductor layer with the second conductor layer; performing a patterning of the first conductor layer to form a first wiring pattern in the first conductor layer; laminating a second film having a first insulating layer and a third insulating layer on the first wiring pattern in such a manner that the first insulating layer is brought into contact with the first wiring pattern; forming a second via-contact layer in the second film, thereby electrically connecting the third conductor layer with the first wiring pattern; performing a patterning of the third conductor layer to form a second wiring pattern in the third conductor layer; laminating a third film having a second insulating layer and a fourth insulating layer on the second wiring pattern in such a manner that the second insulating layer is brought into contact with the second wiring pattern; forming a third via-contact layer in the third film, thereby electrically connecting the fourth conductor layer with the second wiring pattern; performing a patterning of the fourth conductor layer to form a third wiring pattern in the fourth conductor layer; and performing a patterning of the second conductor layer to form a fourth wiring pattern in the second conductor layer.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 7 is a diagram schematically illustrating the roll-to-roll technique;

FIGS. 8A through 8I represent respectively a cross-sectional view illustrating a method of manufacturing a multi-layer circuit wiring board according to Example 1;

FIGS. 14A through 14L represent respectively a cross-sectional view illustrating a method of manufacturing a multi-layer circuit wiring board according to Example 4.

DETAILED DESCRIPTION OF THE PREFERRED EMBODIMENTS

Figure 1:
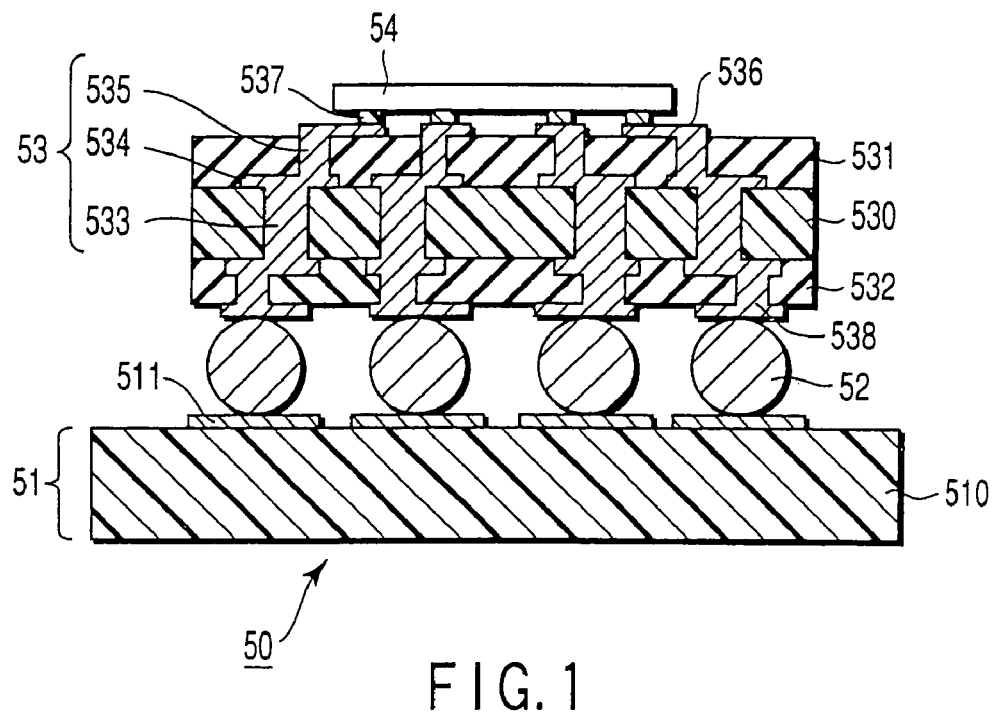
FIG. 1 is a cross-sectional view illustrating one example of an IC package wherein a semiconductor element is mounted on an interposer of BGA structure and mounted on a printed wiring board.

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 2:
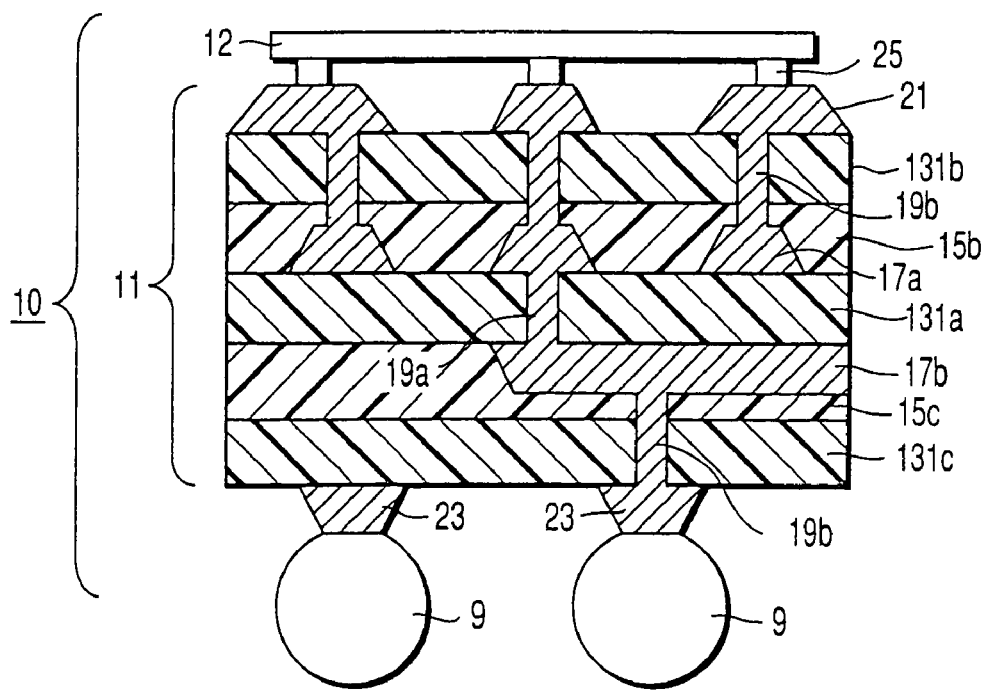
FIG. 2 is a cross-sectional view illustrating an IC package 10 of so-called first level of packaging wherein a multi-layer circuit wiring board 11 and an IC 12 are mounted thereon.

FIG. 2 shows an IC package 10 of a so-called first level of packaging, which is provided with solder balls 9, a multi-layer circuit wiring board 11 and an IC 12. In FIG. 2, the multi-layer circuit wiring board 11 comprises insulating layers 131a, 131b, 131c, adhesive layers 15b, 15c, wiring patterns 17a, 17b, 21, 23, and via-contact layers 19a, 19b. In this multi-layer circuit wiring board 11, the IC 12 is mounted on the wiring pattern 21 and will be packaged through the wiring pattern 23 within a printed wiring board (not shown). The IC package 10 and the printed wiring board (not shown) are designed to constitute an IC package of so-called second level of packaging.

The insulating layers 131a, 131b, 131c are respectively formed of a film made of polyimide resin, polyolefin resin, liquid crystal polymer, etc. Among them, polyimide resin is especially preferable in view of its excellent heat-resistance. Polyimide resin is a heat-resistant polymer and can be manufactured through a condensation reaction between a diamine compound and a tetra-carboxylic acid compound. Especially when an aromatic compound is employed as any one of these compounds, it is possible to manufacture a highly heat-resistant polymer having a glass transition temperature of 350° C.

or more. This highly heat-resistant polymer can be extensively employed as an insulating material for an electronic material and in various forms, e.g. as a film, or as a coating material. However, it is also possible to employ a film or other kinds of materials as long as the film is excellent in heat-resistance, in flexibility and in smoothness, and low in water absorption.

The thickness of these insulating layers may preferably be confined within the range of 12.5 to 80 μm. Because, if the thickness of these insulating layers is less than 12.5 μm, it may become difficult to ensure electric insulation. On the other hand, if the thickness of these insulating layers exceeds over 80 μm, it will invite not only a substantial increase in total thickness of the board but also necessity to increase the wiring line width due to the increased thickness of the insulating layers as the characteristic impedance thereof is taken into account, thereby making it difficult to realize a wiring of high density.

Incidentally, for the purpose of simplifying the explanation of the present invention, these insulating layers 131a, 131b, 131c are all formed of a polyimide layer. The surface roughness of these polyimide layers 131a, 131b, 131c, as measured based on ten point height of irregularities (Rz) as defined by JIS B 0601, may preferably be confined within Rz=0.01 to 5.0. Because, if the ten point height of irregularities (Rz) of these insulating layers is less than 0.01, it would become impossible to secure a sufficient adhesion strength between these insulating layers, thereby deteriorating the layer-to-layer reliability. On the other hand, if the Rz of these insulating layers is larger than 5.0, it may become difficult to form a sufficiently fine pattern.

In particular, in the case where the width of wiring formed on the top surface of a polyimide layer is 50 μm or less, if the Rz becomes 5.0 or more, the non-uniformity of wiring width can no longer be disregarded, so that the noise due to reflection can not be disregarded when signals are passed through the wiring at a high speed. Therefore, the Rz may preferably be 5.0 or less.

The wiring patterns 17a, 17b, the wiring pattern 21 and the wiring pattern 23 are formed from conductor layers laminated respectively on the polyimide layer 131a, the polyimide layer 131b and the polyimide layer 131c by a process to be described hereinafter. As for the raw material to be employed for constituting these conductor layers, i.e. the raw material of the wiring patterns 17a, 17b, 21, 23, it is possible to employ the material constituting the ordinary wiring substrate as it is, and there is no particular limitation with regard to this raw material. Generally, copper foil, for example, can be employed for this purpose. If copper foil is to be employed for forming the conductor layer of wiring, any kind of copper foil can be employed, as long is the copper foil is flat and smooth. For example, electrolytic copper foil, rolled copper foil, etc. can be utilized for this purpose.

The thickness of the conductor layer may preferably be confined within the range of 3 to 18 μm.

On the wiring pattern 21 side of the multi-layer circuit wiring board 11 shown in FIG. 2, there is mounted, via bumps 25, the IC 12. On the other hand, on the opposite side of the multi-layer circuit wiring board 11, the wiring pattern 23 disposed thereon is connected, via solder balls 9, with a printed wiring board (the solder balls as well as the printed wiring board are not shown).

The adhesive layers 15b, 15c are disposed to attach the film 131b to one surface of the film 131a and to attach the film 131c to the other surface of the film 131a. As for the characteristics of these adhesive layers 15b, 15c, there is no particular limitation as long as they are excellent in heat-resistance, in flexibility and in smoothness, and low in water absorption. For example, it is possible to employ an epoxy-based adhesive, a rubber-based adhesive, a polyimide-based adhesive, a polyolefin-based adhesive, an acrylic adhesive, etc. Among them, a thermosetting adhesive containing therein at least an epoxy-curing component is more preferable.

While a thermoplastic adhesive is caused to repeatedly exhibit thermoplasticity at a working temperature of not lower than the melting point thereof, the thermosetting adhesive containing therein at least an epoxy-curing component is capable of enhancing the heat-resistance thereof as it is thermally cured after the lamination thereof, thereby giving a cured product which is excellent in reliability. As for the specific examples of the adhesive containing therein at least an epoxy-curing component, they include, other than an epoxy-based adhesive, an adhesive comprising an acrylic material to which an epoxy-curing component is added, an adhesive comprising a polyimide-based material to which an epoxy-curing component is added, and an adhesive comprising a rubber-based material to which an epoxy-curing component is added. Incidentally, it should not be construed that the adhesive to be employed in the present invention is limited to these adhesives mentioned above. As a matter of course, it may be any other kind of adhesive.

In this specification, the term "epoxy-curing component" means any curing system contains an epoxy compound and a component which is capable of reacting with and curing the epoxy compound. For example, such curing systems include those capable of generating a curing reaction between an epoxy compound and amines; a curing reaction between an epoxy compound and carboxylic acids; a curing reaction between an epoxy compound and phenols; a curing reaction between an epoxy compound and acid anhydrides; a curing reaction between an epoxy compound and polyamide resin; a curing reaction of an epoxy compound by making use of imidazoles; a curing reaction of an epoxy compound by making use of a latent curing agent; or a system which is capable of generating the curing reaction of an epoxy resin through any combination of these curing reactions. Of course, the examples of the epoxy-curing component are not confined to the compounds exemplified above.

Incidentally, the thickness of adhesive layers 15b, 15c may preferably be 30 μm or less. Because, if the thickness of these adhesive layers exceeds over 30 μm, the aspect ratio of via-hole for effecting a layer-to-layer contact may become undesirably enlarged due to the addition of the polyimide layer employed as an insulating layer, thereby making it difficult to form a via-contact layer excellent in reliability.

The via-contact layers 19 are provided for realizing an electric connection between wiring patterns which are formed on the films 131a, 131b, 131c. Therefore, the via-contact layers 19 are respectively constituted by a conductor layer which can be formed by way of a plating treatment, etc.

The bumps 25 are respectively formed of solder, for mounting the IC 12 on the multi-layer circuit wiring board 11.

Figure 3:
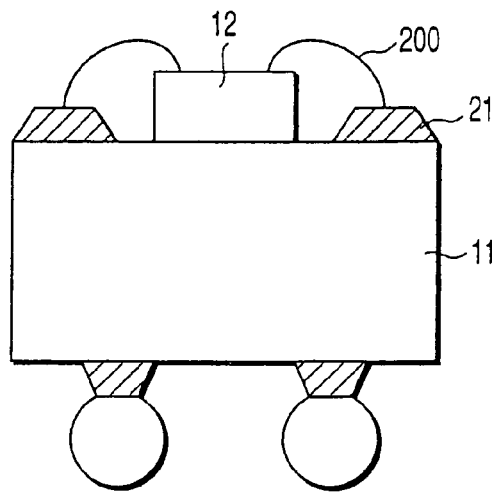
FIG. 3 is a cross-sectional view illustrating another example of the structure wherein an IC 12 is mounted on a multi-layer circuit wiring board.

FIG. 3 shows another example of a structure where the IC 12 is mounted on the multi-layer circuit wiring board 11. In this structure shown in FIG. 3, the IC 12 is mounted on the multi-layer circuit wiring board 11 in such a manner that the electrodes of the IC 12 are directed upward, and that these electrodes are connected with the wiring pattern 21 through a wire bonding using a wire 200 (for example, a gold wire, an aluminum wire, etc.).

Figure 4:
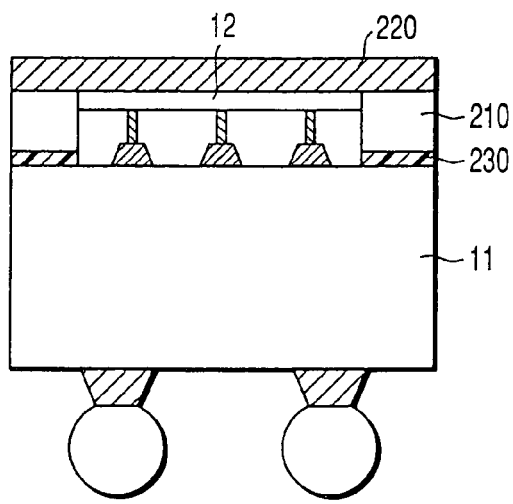
FIG. 4 is a cross-sectional view illustrating a further example of the structure wherein an IC 12 is mounted on a multi-layer circuit wiring board.
Figure 5:
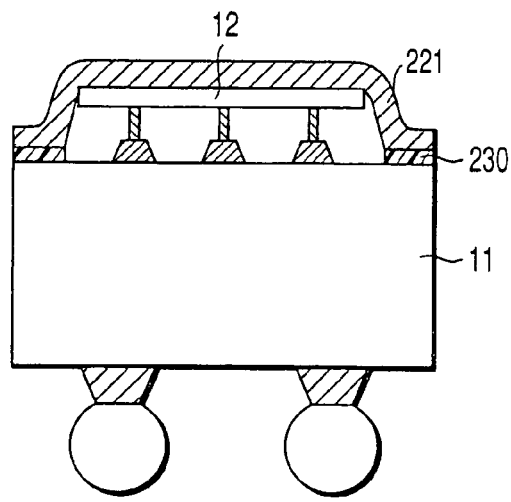
FIG. 5 is a cross-sectional view illustrating a further example of the structure wherein an IC 12 is mounted on a multi-layer circuit wiring board.

FIGS. 4 and 5 illustrate an IC package wherein a metal plate is disposed over the IC 12 that has been mounted as shown in FIG. 2. More specifically, in the embodiment shown in FIG. 4, a fixing frame 210 is adhered in advance by means of an adhesive 230 to a portion of the IC-mounting surface where the IC 12 is not located, and then, the opening encircled by the fixing frame 210 is closed by a flat metal plate 220, thereby sealing the IC 12. On the other hand, in the embodiment shown in FIG. 5, a fixing frame is not employed, and instead, a molded metal plate 221 is placed over the IC 12 to thereby sealing the IC 12. As for the material for the fixing frame 210, it is possible to employ a metal, a resin or a hybrid material consisting of an inorganic material and an organic material. These metal plates 220 and 221 are both capable of functioning not only as a member for sealing the IC 12 but also as a radiating plate.

Figure 6:
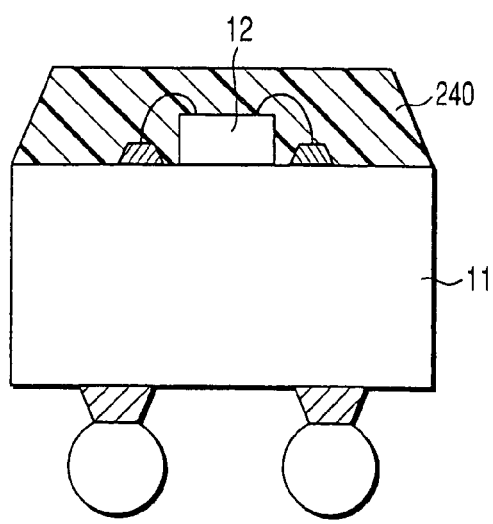
FIG. 6 is a cross-sectional view illustrating a further example of the structure wherein an IC 12 is mounted on a multi-layer circuit wiring board.

FIG. 6 illustrates a structure wherein the IC 12 that has been mounted as shown in FIG. 3 is sealed by making use of a sealing resin 240. This resin sealing can be performed by a potting method wherein a resin solution is dropped from the top of the IC 12 to thereby seal the IC 12, or by a transfer molding method wherein a fused resin is poured over the IC 12 by making use of a mold.

Since the multi-layer circuit wiring board 11 described above is formed of polyimide resin and the like, the multi-layer circuit wiring board 11 is flexible. Accordingly, the multi-layer circuit wiring board 11 can be mass-produced by way of a roll-to-roll system.

Next, the details of this roll-to-roll system will be explained. As shown in FIG. 7, according to this roll-to-roll system, a tape substrate is unwound from an unwinding section and transferred to a processing section to treat the tape substrate, thereby manufacturing a multi-layer circuit wiring board, which is then taken up at a take-up section. This method is advantageous in that the productivity of the multi-layer circuit wiring board is excellent. Since the unwinding and rewinding of a tape substrate are performed in this method, the tape substrate to be employed herein is required to be flexible to a prescribed degree. Therefore, the conventional tape substrate made of glass epoxy resin cannot be employed in this roll-to-roll system.

The multi-layer circuit wiring board 11 is constituted by multiple layers of circuit wiring (in FIG. 2, a four-ply circuit wiring consisting of wiring patterns 17a, 17b, 21 and 23). Therefore, a semiconductor device having a large number of terminals can be mounted thereon, and the transmission of signals can be performed effectively and at a high speed. Furthermore, the high integration of semiconductor devices can be further advanced. Still further, all of the wiring patterns 17a, 17b, 21, 23 can be bonded smoothly and strongly to the polyimide layers 131a, 131b, 131c. Therefore, as compared with the wiring board provided with an irregular surface for realizing a strong bonding, this multi-layer circuit wiring board 11 is capable of exhibiting a higher signal transmitting efficiency.

Further, according to a manufacturing method to be set forth hereinafter, it is possible to further increase the layers of the multi-layer circuit wiring board 11 (namely, to provide it with four or more layers of circuit wiring). As a result, it is now possible to realize the mounting of a semiconductor device having a large number of terminals, the enhancement of the speed and efficiency in transmitting signals, and a further enhancement in integration of semiconductor devices.

Manufacturing Method of Multi-Layer Circuit Wiring Board:

Next, a typical lamination process of the multi-layer circuit wiring board 11 will be explained. Incidentally, specific examples of manufacturing process will be explained in detail with reference to the examples to be discussed hereinafter.

The lamination process of the multi-layer circuit wiring board 11 can be generally divided into the step of laminating films, the step of forming via-holes, and the step of forming wiring patterns. The details of each of these steps will be explained as follows.

1. Step of Lamination:

In this step of lamination, a film having a conductor layer on one surface thereof is laminated on another film having a wiring pattern on at least one of the surfaces thereof in such a manner that said conductor layer is placed on one outer side of the resultant laminate. Although it is not intended to limit the step of lamination, a lamination apparatus such as an ordinary press or laminator can be utilized in this lamination step. More preferably, in order to prevent the generation of bubbles or voids, the employment of a vacuum press or a vacuum laminator is preferable. Further, because of the reason that productivity can be improved, the laminate may preferably be produced by way of the aforementioned roll-to-roll system.

The lamination of films can be performed by a method wherein an adhesive layer formed of an adhesive is newly provided, or by a method wherein a film having an adhesive property is employed, thus unnecessitating the provision of an adhesive layer. The film having adhesive property can be represented by a thermoplastic film exhibiting thermoplasticity, such as a thermoplastic polyimide or liquid crystal polymer. When these films are employed, the lamination can be performed by making use of a single body of film without necessitating the provision of an adhesive layer.

When the provision of an adhesive layer formed of an adhesive is required, the adhesive to be employed in this example may be conceivably formulated as a varnish type or as a film type. Although it is not intended to limit the type of the adhesive, the employment of this film type is more preferable in view of its excellent productivity. When an adhesive of this film type is to be employed, the following lamination method can be employed. Namely, a film provided with a wiring on at least one surface thereof, a film-like adhesive and a film provided with a conductor layer on one surface thereof are concurrently laminated with each other to fabricate a laminated film. Alternatively, it is also possible to employ a method wherein a film-like adhesive is laminated on a film provided with a wiring on at least one surface thereof, and then, a film provided with a conductor layer on one surface thereof is further laminated thereon. Additionally, it is also possible to employ a method wherein an adhesive layer is applied to a film provided with a conductor layer on one surface thereof, and then, a film provided with a wiring on at least one surface thereof is further laminated thereon.

When an adhesive of the varnish type is to be employed, the following lamination method can be employed. Namely, an adhesive is coated on the surface of a film provided with a wiring on at least one surface thereof to form an adhesive layer, and then, a film provided with a conductor layer on one surface thereof is further laminated to fabricate a laminated film. Alternatively, an adhesive is coated on the surface of a film provided with a conductor layer on one surface thereof to form an adhesive-attached film, which is then laminated with a film provided with a wiring on at least one surface thereof by making use of the adhesive to thereby fabricate a laminated film. Of course, the method of forming such a laminated film is not limited to these methods mentioned above.

The adhesive layer mentioned above may preferably be constituted by an adhesive containing, as a main component, a resinous adhesive such as an epoxy-based adhesive, a rubber based adhesive, a polyimide-based adhesive, a polyolefin-based adhesive, an acrylic adhesive, etc. The reason to employ these adhesives is mainly to secure the insulating property of a thin film, though it may depend on a specific composition of the adhesive. When these resin-based adhesives are employed as a main component, it is possible to form a via-hole by means of a low energy density laser to be employed in working these resins.

When this laminating process is to be performed without any intervention of an adhesive, it can be performed by making use of a thermoplastic film for example. This thermoplastic film is provided with adhesive property. Accordingly, it is possible to obtain a laminated film by laminating a film provided with a conductor layer on one surface onto a film provided with a wiring on at least one surface thereof in such a manner that the conductor layer is placed to constitute an outer surface of the resultant laminate.

Further, when a thermoplastic film requiring a very high working temperature is to be employed, the lamination may be performed by making use of an adhesive layer having adhesive property for the convenience of working process thereof. Further, in view of enhancing the adhesive strength, an adhesive layer may be attached to the thermoplastic film in obtaining the lamination.

When the lamination is to be performed using a film having wirings on opposite surfaces thereof, the lamination of another film to each of the surfaces can be performed successively or concurrently. It is possible, in any of such methods, to manufacture the multi-layer circuit wiring board 11. However, the lamination of other films onto both surfaces of the film may preferably be performed concurrently in view of enhancing the productivity.

In all of the aforementioned methods of laminating a film provided with a conductor layer on one surface thereof onto a film provided with a wiring, it is preferable to roughen the surface of the wiring pattern. As the surface of the wiring pattern is roughened, the area of the adhesion surface can be increased, and due to the anchoring effect derived from the resultant irregular surface, the adhesion strength between adhered layers can be enhanced.

Followings illustrate one example of this roughening treatment.

By making use of an apparatus which is capable of transferring a trip of film by way of the roll-to-roll system, a roughening agent (CZ-8101: Mech Co., Ltd.) was sprayed against the surface of patterned conductor to form fine irregularities thereon, which was washed with an acid and then, with water. After being dried, the patterned conductor was subjected to a surface-roughening treatment.

The conditions for this surface-roughening treatment were: 30° C. in temperature of the roughening agent; and 0.1 MPa in spray pressure. The degree of surface roughness obtained from the surface-roughening treatment under the aforementioned was 1.5 µm at a film-transferring speed of 1.0 m/min. The degree of surface roughness can be adjusted by controlling the transferring speed of the film.

The surface roughness of the surface of the wiring pattern may preferably be confined within the range of 0.1 to 10.0 as measured based on the ten point height of irregularities (Rz) as defined by JIS B 0601. Because, if the surface roughness based on the ten point height of irregularities (Rz) is smaller than 0.1, the adhesive strength of the film can be hardly improved, while if the surface roughness based on this Rz is larger than 10.0, it may become difficult to maintain the configuration of the wiring pattern.

2. Step of Forming Via-Contact Layer:

2-1. Formation of Via-Hole:

The working for forming a via-hole can be performed by making use of a mechanical drill, carbon dioxide gas laser beam, ultraviolet ray laser beam, excimer laser beam, etc. The mechanical drill is capable of forming only a through-hole, whereas the drilling work using a laser beam makes it possible to form not only a through-hole but also non-through-hole (which corresponds to a blind via).

If the provision of through-holes is permitted in designing a circuit wiring board, the holes can be formed using a mold or a mechanical drill such as an NC drill. When a mold is employed, a plurality of holes can be formed en bloc at predetermined locations of the wiring board. Further, even in a drilling work using the NC drill, a plurality of holes can be formed en bloc by multiplying the shaft of the NC drill. Moreover, even in the employment of the NC drill, it is possible, by suitably manipulating the drilling work (the control of depth-wise working direction), to form not only through-holes but also a non-through-hole. Even in the formation of a blind via, the laser seed may be suitably selected by taking into consideration the productivity, the stability of apparatus (easiness of maintenance) and characteristics of laser beam. Namely, the formation of holes may preferably be performed by taking into consideration the design of the circuit wiring board to be manufactured and the manufacturing cost, etc.

As for the kinds of laser beam generally utilized as a laser beam in the working machine, there are known carbon dioxide gas laser (wavelength: 9.3-10.6 µm), YAG laser (fundamental wavelength: 1.06 µm), YAG, YLF, YAP and YVO4 lasers of ultraviolet region (wavelength of third harmonic: 355 nm; wavelength of fourth harmonic: 266 nm), and excimer laser (wavelength of XeCl: 308 nm; wavelength of KrF: 248 nm; and wavelength of ArF: 193 nm). Among these laser beams, the carbon dioxide gas laser is the highest in energy density per pulse. According to this carbon dioxide gas laser, the hole-forming treatment can be performed at a high speed. However, this carbon dioxide gas laser is limited in forming a hole of minute diameter, i.e. the minimum diameter which can be realized by the employment of this carbon dioxide gas laser is considered as being at most 50 µm or so.

Further, when it is desired to directly work a metal layer which has been formed on a polyimide layer, a special pretreatment such as a blacking treatment for enhancing the absorption of optical energy is required to be performed. Because, the zone of absorption wavelength of polyimide differs from that of the metal. Further, the excimer laser is advantageous in that, although the excimer laser is a kind of gas laser, it is capable of working a hole of very small diameter such as 20 µm. However, this excimer laser may not be applicable, on some occasions, to mass production due to the high cost for securing consumable goods such as a high reflection metal oxide mask and maintaining the atmosphere for the laser.

Since the ultraviolet laser beams that can be derived through a conversion of wavelength of a solid crystal such as YAG, YLF, YAP and YVO4 overlaps with the absorption wavelength of the metal, they are capable of directly working a conductor layer. Further, since these ultraviolet laser beams are capable of contracting the focus of working point down to a very small diameter as compared with that of carbon dioxide gas laser, it is possible to form a hole of very small diameter such as 30 µm or less. Incidentally, the hole-forming speed of these ultraviolet laser beams is questioned at present. However, this problem is now going to be solved through the enhancement of oscillating frequency of laser beam and the multiplication of the working heads.

Incidentally, since the wavelength of ultraviolet region is higher than the dissociation energy of insulating resin, it is called pholysis working. Since the working to be effected by the carbon dioxide gas laser is thermal working, it may not be possible, on some occasions, to obtain reliable electrical connection between layers through the provision of a via-contact unless the removal of residues (smear), i.e. the residues resulting from the working of resin, is carefully performed. However, when ultraviolet laser is employed, the molecular chains of resin can be dissociated, thereby making it possible to considerably reduce the generation of such residues.

Although the details of treatment will be made clear in the examples to be discussed hereinafter, ultraviolet laser having a high energy density, for example, is irradiated onto and passed through the conductor layer of a substrate comprising, on its opposite surfaces, two adhesive layers, with a circuit wiring substrate being interposed therebetween (see FIG. 8A). On the other hand, against the polyimide film, preferably, an ultraviolet laser having a low energy density is irradiated to thereby form a blind via which is a non-through-hole (see FIG. 8C). Since the ultraviolet laser of low energy density to be employed for working the polyimide film is incapable of working the conductor layer, a non-through-hole can be formed by taking advantage of a difference in density of energy.

On this occasion, when the film thickness of the conductor layer is reduced to the range of 3 to 8 μm by way of soft etching, the working of the conductor layer can be facilitated and hence to shorten the working time.

2-2. Removal of Dross:

Generally, the effects of ultraviolet laser beam on a metal in the working of the metal are derived, as a main factor, from the thermal fusion of the metal, so that the metal fused by the ultraviolet laser beam is permitted to disperse as is well known in the art. In this manufacturing method also, the metal constituting the conductor layer is permitted to disperse as a result of the working thereof on the occasion of directly forming holes in the conductor layer. The dispersed particles of the metal are called dross, which is required to be removed by all means in a step after the working of the metal by making use of a laser beam. Because, if the dross builds up along the edge of an opening of a hole to a height of 1 to 3 μm, it may be an obstacle in the chemical treatment in the next step.

The dross of this kind can be removed by various means, such as physical polishing, using abrasive grains, chemical polishing by way of acid treatment, or a method of re-irradiating ultraviolet laser beam against the dross to thereby flatten the dross. The features of each of these dross-removing methods are as follows.

The physical polishing is designed such that by making use of a buff roll or a flat polishing paper, a substrate is entirely polished. Accordingly, when the substrate is formed of a film-like substrate, the generation of the extension of the substrate is feared. Further, it is also feared that useless matter may be left remained inside the via-hole after the polishing of the substrate. Since the dross can be dissolved by an acid in the case of chemical polishing, the problem of residual useless matter will be overcome. Further, according to the chemical polishing, it is possible to remove only the dross by making use of a chemical solution of a suitable concentration. Because, the dross is characterized by its fine rugged surface.

The employment of a laser beam is featured in that it is not intended to remove the dross but to flatten the dross to thereby prevent the dross from becoming an obstacle in the next step. In the case of physical or chemical polishing, a production line which is designed exclusively for the polishing is required. However, when the treatment of dross is performed immediately after the formation of the hole by making use of the same laser apparatus, the production line can be shortened. However, since this treatment of dross at the hole is required to be performed one by one, the speed of this treatment may become a problem.

Although several examples for the removal of dross have been discussed above, the treatments which can be used for the removal of dross are not limited to these examples.

2-3. Adjustment of Aspect Ratio:

In order to make the chemical treatment of via-hole smooth, the via-hole to be formed may preferably be tapered in configuration. More specifically, the ratio of the diameter of the bottom of the via-hole to the diameter of the top opening thereof may preferably be confined within the range of 0.2 to 1.0. Incidentally, when the ratio of the diameter of the bottom to the diameter of the top opening is more than 1.0, the configuration of the via-hole would become a reversed taper-like configuration. On the other hand, when this ratio becomes smaller, the degree of normal taper-like configuration would become increasingly sharp.

Generally, according to a wet treatment including a treatment using a chemical solution, the circulation of the liquid thereof inside the via-hole would be facilitated as the configuration of the via-hole is normally tapered rather than reversely tapered. However, a smaller ratio of the diameter of the bottom to the diameter of the top opening is indicative of a smaller contact area of the bottom portion to the underlying conductor, thereby leading to the deterioration of reliability of the electrical connection of the via-contact layer. Therefore, the aspect ratio may preferably be confined within the range of 0.4 to 0.8 or so.

The aspect ratio (the thickness of insulating layer/the diameter of the opening of via-hole) of the conventional via-hole is around 0.5 (for example, 50 μm in thickness of the insulating layer against 100 μm in diameter of the opening of the via-hole). Therefore, problem has been scarcely raised with regard to the circulation of liquid into the via-hole on the occasion of the treatment thereof using a chemical solution. However, when the via-hole is required to be designed and worked so as to make it smaller in diameter, the aspect ratio would become 1 or more, so that the circulation of liquid into the via-hole would be required to be taken into account. Because, if this liquid circulation is deteriorated, voids would be more easily generated inside the via-hole, thereby deteriorating the reliability of the electrical connection of the via-contact layer.

According to this embodiment, for the purpose of making the circulation of a chemical solution smoother, the film thickness of the conductor layer is minimized before or after the step of forming the via-hole to thereby reduce the aspect ratio. This can be specifically performed by the same treatments as employed on the occasion of removing the dross, i.e. a physical polishing, a chemical polishing and a treatment using laser beam. Since the physical polishing and chemical polishing are respectively a treatment which is applied to the entire surface of film substrate, the film thickness of the top conductor can be uniformly reduced. On the other hand, according to a treatment using laser beam, only the edge portion of the opening of via-hole can be selectively treated, thereby making it possible to individually reduce the aspect ratio of each of the via-holes. By making use of these treatments, the aspect ratio can be reduced to 1.5 or less, more preferably 1.0 or less, thereby assisting the treatment using a chemical solution in the following step.

In view of minimizing the production line, the reduction of the aspect ratio of the via-hole may preferably be performed concurrent with the removal of the dross.

2-4. Removal of Residue (Smear): Desmear

Residue (smear) which is a resinous residue left unremoved even after the irradiation of laser beam executed following the formation of via-hole by making use of ultraviolet laser beam may be sometimes permitted to exist in the vicinity of the edge of the bottom portion of the via-hole. In such a case, if the residue can be completely removed, the reliability of electrical connection between layers by way of the via-contact layer can be enhanced. The removal of such a residue is called desmear in the art. The quantity of this residue is very little. However, unless this residue is completely removed, the electrical connection between layers by way of the via-contact layer would be obstructed and the reliability of the via-contact layer would be deteriorated. The removal of this residue can be performed by a dry method or by a wet method. In the case of the dry method, the residue is chemically reacted with oxygen radical existing in a plasma atmosphere of a mixed gas comprising fluorine gas and oxygen gas, thereby removing the residue. On the other hand, in the case of the wet method, the residue is dissolved by making use of permanganate of an alkaline solution to thereby remove the residue.

Since the treating liquid to be employed for the removal of residue is high in processing speed, permanganate to be employed in a wet method is generally employed. In this wet method, the surface of film is roughened by the effect of oxidative decomposition, and due to the resultant anchoring effect of this roughened surface, the adhesiveness thereof to a plated metal can be provided. Furthermore, due to the introduction of oxygen atom and additional introduction of a polar group into the surface of resin, the hydrophilicity of the surface of resin can be further enhanced, thereby making it possible to enhance the wettability of a plating liquid and hence to enhance the adhesive strength of the surface of resin.

Further, when polyimide is employed as an insulating material, it is possible, through an alkaline treatment, to open the imide ring of polyimide which is exposed to the sidewall of the hole, thereby enabling carboxylic group and amino group to be formed on the surface of the sidewall. As a result, the adhesiveness of the sidewall of the hole to palladium metal for forming a metal film in the following step will be enhanced.

After the step of desmear, a metal film for example is formed inside the via-hole, the resultant metal film being subsequently employed as an electrode so as to enable a metal plating having a predetermined thickness to be formed on the sidewall and bottom of the hole, thereby accomplishing the via-contact. In order to enable the via-contact layer to be formed by means of electrolytic plating, the aforementioned treatment for providing electric conductivity to the hole is required. If this treatment is insufficient, it may become a large factor for generating voids in the via-contact layer, and therefore, this treatment may be carefully performed.

2-5. Treatment for Providing Conductivity:

The treatment for providing conductivity to the interior of a via-hole can be roughly classified into DPS (Direct Plating System) and electroless copper plating. The DPS is a method wherein, for example, a tin/palladium-based catalyst, a conductive polymer, carbon graphite, etc. are applied to the entire surface inside the via-hole, thereby allowing molecules which are negatively electrified to be adsorbed onto the surface, the molecules being subsequently reduced, by making use of a reducing agent, to metal palladium. On the other hand, the electroless copper plating is a method wherein the hole is treated with an aqueous solution of palladium, thereby enabling palladium to become a catalytic nucleus in an electroless copper plating bath to allow copper to be precipitated.

When both methods are compared with each other, any of these methods can be considered as a catalyst-substitution type plating technique. As far as the steps and treating time are concerned however, the DPS is smaller in number of steps and shorter in treating time as compared with the electroless copper plating. Further, with respect to the easiness of conductivity examination, the examination in the case of the electroless copper plating is performed after finishing the copper plating conducted following the formation of the metal film, thereby making it possible to confirm the conductivity-providing treatment. In the case of the DPS, since the catalyst is employed as a nucleus and a metal film is formed during the electrolytic copper plating, the examination is performed by measuring the surface resistance after the DPS treatment.

2-6. Electrolytic Plating:

The electrolytic plating is performed using a film substrate as a cathode after the conductivity-providing treatment of the interior of the via-hole. Usually, in view of cost and productivity, electrolytic copper plating is selected. This electrolytic copper plating is required to be performed by all means. Unless this electrolytic copper plating is performed, the via-contact cannot be created in the case of the DPS, while in the case of electroless copper plating, since the precipitation speed of plating is 1-3 μm/hour, it would be impossible to secure satisfactory mass production by the employment, as it is, of the electroless copper plating. In the case of the electrolytic plating, a film substrate is employed as a cathode and the current density in the electrolytic bath containing copper sulfate as a main component is controlled to 1-4 $A/dm^2$ or so and voltage is continued to apply thereto for several tens minutes, thus allowing electrolytic copper, plating to grow.

Incidentally, depending on the magnitude of current density in the electrolytic copper plating, the following difference would be created. Namely, although it may depend on the configuration of the via-hole (i.e. the diameter of the opening and aspect ratio), when the electrolytic plating is performed at a high current density (for example, 4 $A/dm^2$), it may be possible to realize a high speed growth of plating, but voids may be generated at a high probability if the circulation of plating liquid inside the via-hole is insufficient. On the other hand, when the electrolytic plating is performed at a low current density (for example, 1 $A/dm^2$), the speed of growing the plating would be slow, but due to this slow growth of plating, the probability of generating voids inside the via-contact layer can be minimized and the productivity would be deteriorated. In view of enhancing the quality of the via-contact layer and of improving the productivity, the current density may preferably be confined within the range of 1-4 $A/dm^2$ or so.

Incidentally, it may be possible, through the employment of two stages of current density or more on the occasion of forming the via-contact layer, to increase the speed of forming the via-contact layer and to improve the productivity while making it possible to suppress the generation of voids. For example, the current density may be controlled to 1 $A/dm^2$ until the aspect ratio of via-hole is changed from 1.0 to 0.6 by the application of electrolytic plating, and to 2 $A/dm^2$ until the aspect ratio of via-hole is changed from 0.6 to 0.3 by the application of electrolytic plating, and to 4 $A/dm^2$ until the aspect ratio of via-hole is changed from 0.3 to 0 by the application of electrolytic plating. Herein, when the aspect ratio becomes zero, it means the accomplishment of the via-contact layer.

When the current density is adjusted in this manner, it would be possible to realize an electrolytic copper plating method which is capable of suppressing the generation of voids and enhancing the productivity.

This electrolytic copper plating method can be realized by constructing a production line having a plurality of plating baths, so that the existing plating apparatus would be sufficiently capable of coping with this plating method. Furthermore, without being restricted by the specific configuration of the via-hole, the aforementioned manufacturing method can be applied not only to a configuration of via-contact where a film of predetermined thickness is formed on the sidewall of the hole (conformal via) but also to a configuration of via-contact where the interior of the hole is completely filled with a metal (field via).

When the plating in the via-hole shown in FIG. 8C is controlled in such a manner that either, the value of (a value of the opening of the via-hole)/(a total value of the thickness of the conductor layer+the thickness of the second film or the third film+the thickness of the first adhesive layer or of the second adhesive layer) or the value of (a value of the opening of the via-hole)/(a total value of the thickness of the conductor layer+the thickness of the first film) is confined to 1.5 or less, the chemical solution can be easily introduced into the hole, thereby making it possible to perform a stable plating. A more preferable range of the aforementioned values is 1.0 or less.

3. Step of Forming a Wiring Pattern:

As for the method of working wirings, there are known a subtractive method where an etching treatment is utilized and a semi-additive method where an electrolytic plating is utilized. Incidentally, the present invention will be further explained with reference to drawings illustrating specific steps described in the following examples. However, the present invention will not be restricted by these specific steps.

<Subtractive Method>

Figure 8D:
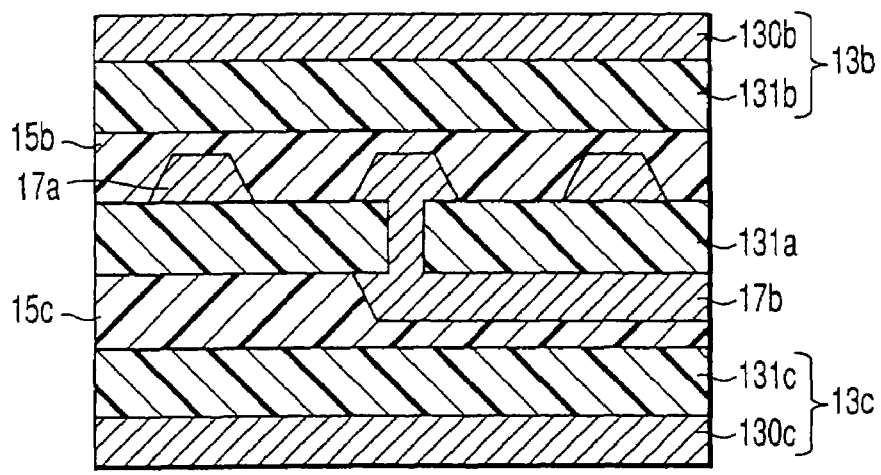
Figure 8E:
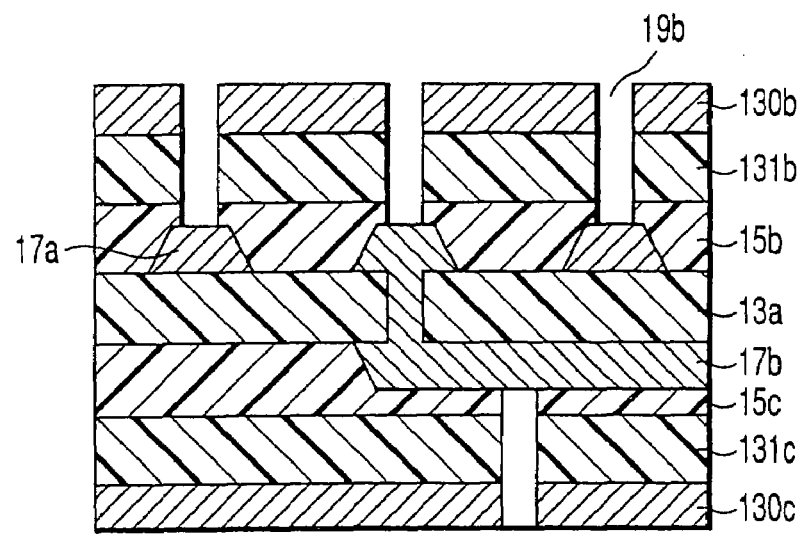
Figure 8F:
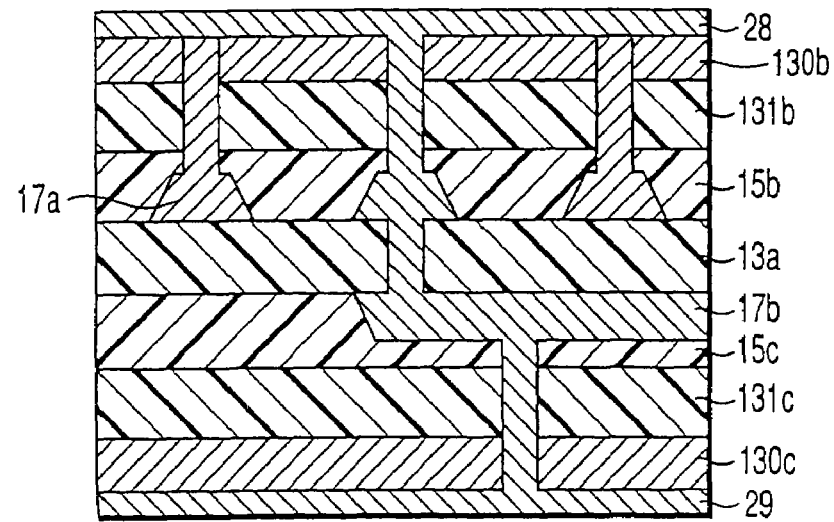

According to the subtractive method, since it is designed such that a deposit layer is formed on the surface of a conductor layer on the occasion of creating electrical connection between the conductor layer formed on the polyimide layer and the via-contact layer, the film thickness would be increased as a whole (for example, the deposit layer 28 in FIG. 8F). When it is tried to work the conductor layer having such a large film thickness for the purpose of forming a wiring by means of etching, it would be badly affected by the side etching, thereby making it difficult to perform the wiring work. If it is desired to overcome such a problem, a soft etching is required to be applied to the deposit layer and also to the conductor layer to thereby optimize the thickness thereof. Namely, the film thickness in this case may preferably be confined within the range of 3 to 10 µm and the non-uniformity in film thickness of these layers may preferably be suppressed to 20% or less.

The treating liquid for this soft etching can be suitably selected depending on the material of the conductor layer. For example, when copper which is commonly employed is used is a conductor layer and as a deposit layer, it is possible to employ a system comprising an aqueous hydrogen peroxide solution+sulfuric acid; or peroxodisulfates such as sodium peroxodisulfate and ammonium peroxodisulfate.

Figure 8G:
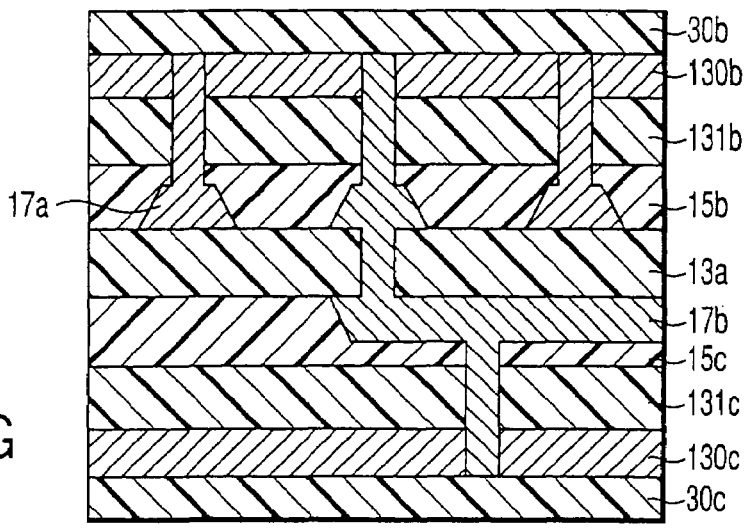

After finishing the soft etching treatment, a resist layer is formed on the surface of the conductor layer, the resist layer being subsequently formed into a mask having a desired pattern. FIG. 8G shows the resist layer 30 that has been formed in a step of working a wiring in Example 1 described below.

In this case, depending on the conditions for forming the deposit layer, the polishing speed of the deposit layer in the soft etching may be caused to differ from the polishing speed of the conductor layer, so that the portion of interface between the conductor layer and the deposit layer may be exposed non-uniformly in a midway of the process for reducing the film thickness thereof by means of soft etching. If such a situation happens to occur, it may become a cause for generating the non-uniformity of the surface condition or of the film thickness after the soft etching treatment. Therefore, it is preferable to form the conductor layer and the deposit layer in such a way that the film thickness of the conductor layer is controlled in advance so as to make the film thickness of the conductor layer become smaller than a predetermined desired film thickness by a thickness of at least 0.5 µm by means of the soft etching, after which the deposit layer is formed. This soft etching step for adjust the film thickness of the conductor layer in advance may be also utilized in and executed concurrent with the step of removing the dross subsequent to the step of laser working.

As for the material for this resist layer, it may preferably be selected from materials which are fundamentally resistive to the etching liquid to be employed in the working of the conductor layer and can be easily removed in the final step of removing the resist layer. Further, the material for this resist layer can be suitably selected depending on the method of forming the openings. Specifically, when the openings are to be formed by making use of photolithography, it is preferably to employ a photosensitive resin which is excellent in resistance to the etching solution. More specifically, a dry film resist or a liquid photosensitive resin resist would be suitable for use. Because when these resist materials are employed, an etching solution will be enabled to easily enter the openings and it becomes possible to form the resist layer having such a film thickness that can be prevented from being damaged during the etching treatment, i.e. a film thickness ranging from 3 µm to 7 µm. Further, when the openings are to be formed by means of laser working, the material for this resist layer can be selected from various kinds of resins. However, when the easiness in executing the subsequent step or the resist layer-removing step is taken into account, the employment of a photosensitive resin is more preferable.

Incidentally, if required, for the purpose of protecting the surface of the substrate which is opposite to the wiring-forming surface, the resist layer may be formed on the surface of the substrate which is opposite to the wiring circuit-forming surface (namely, when wiring working is to be performed to the conductor layer 130b, the resist layer 30 may be formed on the surface of the conductor layer 130c). As for the materials for the resist layer to be formed on this opposite surface, they may be selected from any kinds of materials as long as they are excellent in resistance to the plating solution and can be easily removed therefrom. Namely, the material for this resist layer may not necessarily be required to be the same as that of the resist layer to be applied to the wiring-working surface.

Figure 8H:
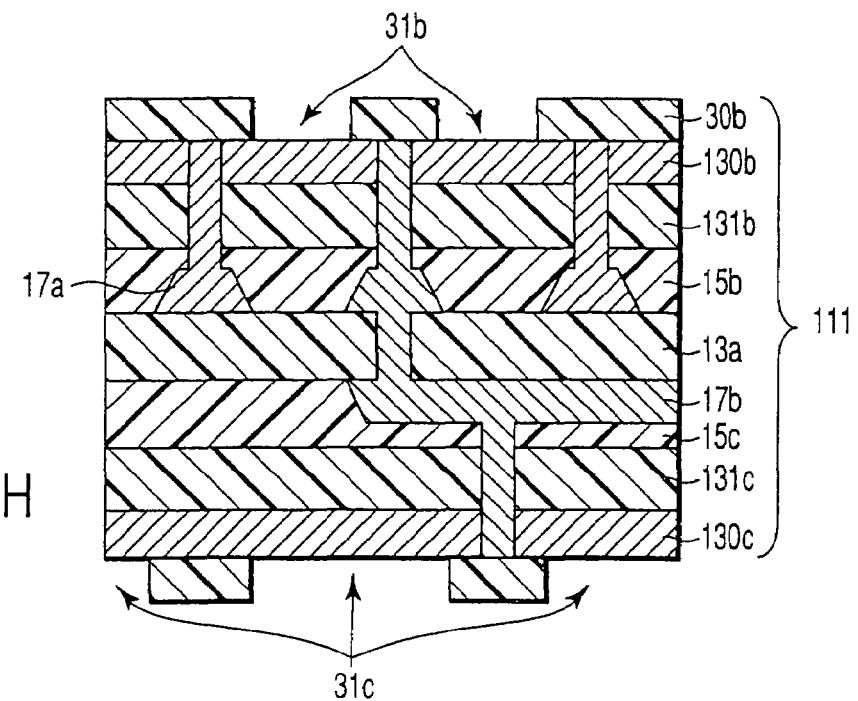

By making use of the aforementioned resist layer formed in this manner as an etching mask, the etching treatment of the conductor layer is performed to thereby work the wiring pattern (see FIG. 8H). The etching liquid to be employed in this etching treatment can be selected depending on the kind of material constituting the conductor layer. For example, when copper is employed for the conductor layer, a solution of iron(III)chloride or a solution of copper(II) chloride can be employed in general as the etching liquid. Among them, the employment of a solution of iron(III)chloride is more preferable in viewpoints of the processing speed of etching and of the excellent finishing of the etched surface. On the other hand, the employment of a solution of copper(II) chloride is more preferable, from the viewpoints of the easiness in controlling the etching liquid and of the stability of the etching liquid.

Figure 8I:
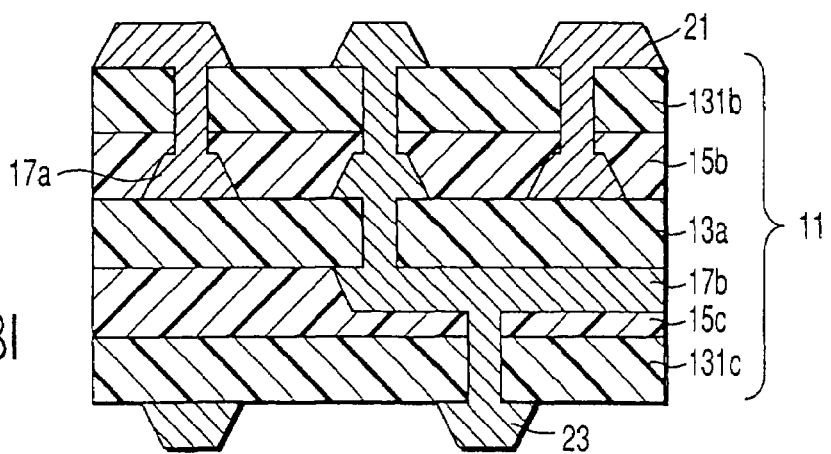

Finally, the resist layer is removed to obtain a wiring circuit board (see FIG. 8I).

<Semi-Additive Method>

Figure 9A:
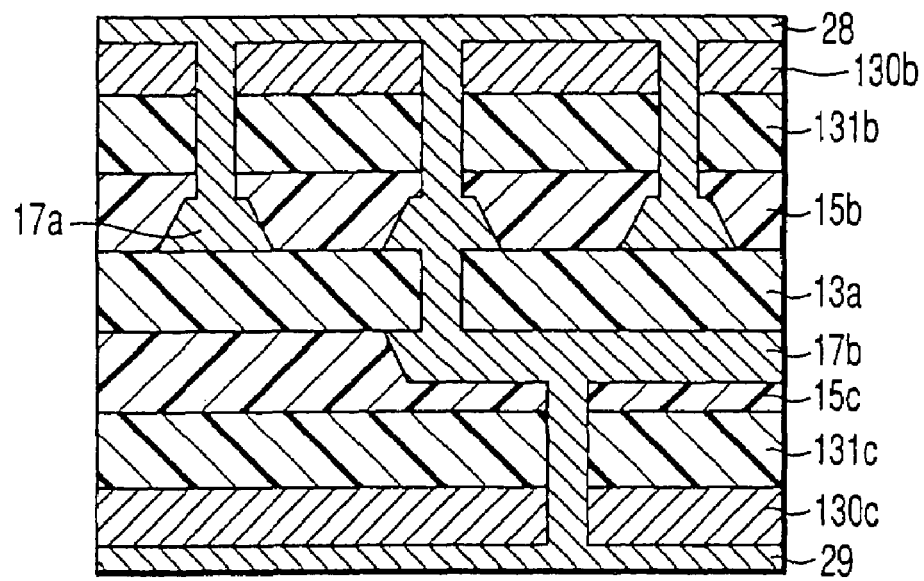
FIGS. 9A through 9E represent respectively a cross-sectional view illustrating a method of manufacturing a multi-layer circuit wiring board according to Example 1.

In this semi-additive method, the conductor layers 28 and 29 shown in FIG. 9A are soft-etched so as to reduce the film thickness thereof to a desired thickness. The film thickness reduced in this manner may preferably be confined within the range of 0.5 to 3 µm for the purpose of removing useless matters by means of soft etching in the final step of removing the thin conductor layer. Further, the non-uniformity in film thickness of these layers may preferably be suppressed to 20% or less. Incidentally, the treating liquid to be employed in the soft etching may be the same as that to be employed in the subtractive method.

In this case, it is also possible to employ a method wherein a thin conductor layer having a film thickness of 0.5 to 3 µm is formed by means of electroless plating after the conductor layers 28 and 29 have been completely removed by means of soft etching or etching.

Figure 9B:
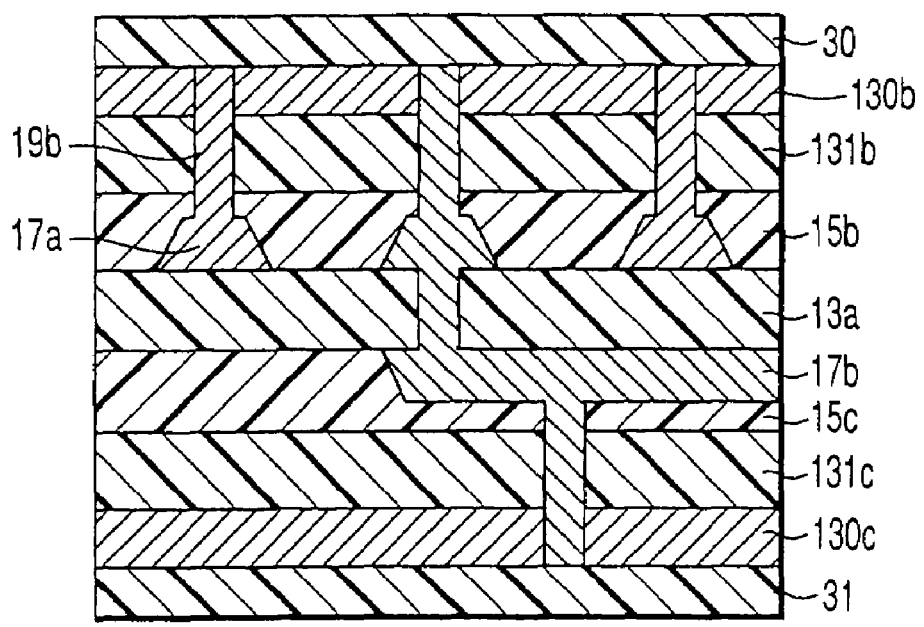
Figure 9C:
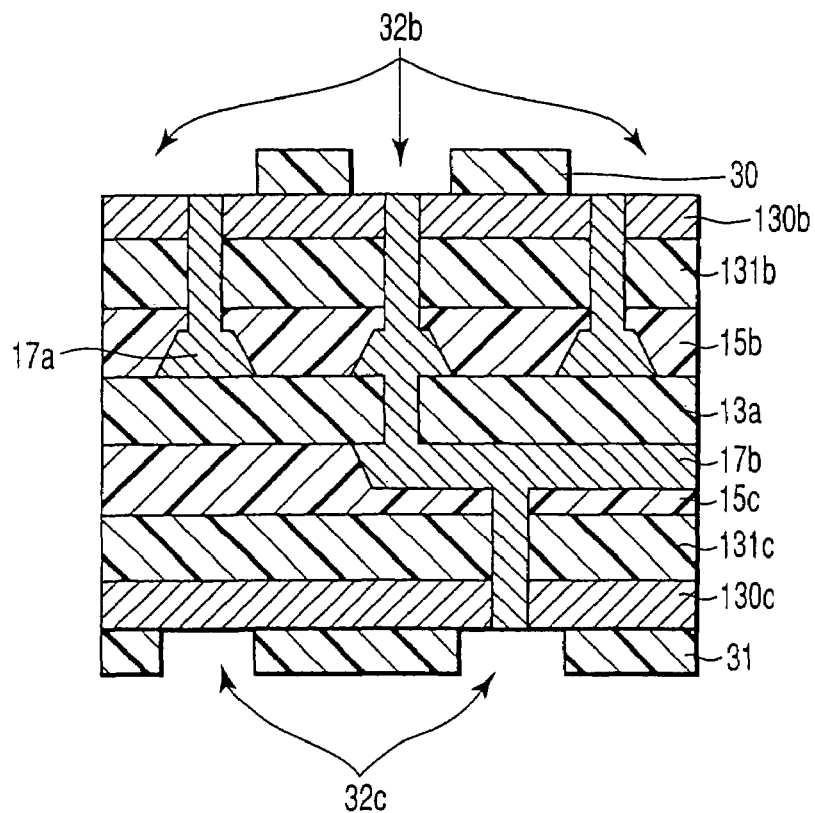

Next, resist layers 30 and 31 are deposited on these thin-filmed conductor layers 28 and 29 (see FIG. 9B), and openings 32b and 32c formed into a desired pattern are formed in the resist layers 30 and 31 (see FIG. 9C). In this case, these resist layers 30 and 31 may be selected from materials which are fundamentally excellent in resistance to the plating liquid to be employed in the formation of the conductor layer and which can be easily removed in a subsequent resist layer-removal step.

The material for these resist layers 30 and 31 can be suitably selected depending on the method of forming the openings 32b and 32c. Specifically, when the openings 32 are to be formed by making use of photolithography, it is preferably to employ a photosensitive resin which is excellent in resistance to the plating. Generally speaking, the employment of a dry film would be preferable because of the facts that a resist layer of uniform thickness can be obtained and the process involved can be facilitated. Further, when the openings are to be formed by means of laser working, the material for this resist layer can be selected from various kinds of resins. However, when the easiness in executing the subsequent step or the resist layer-removing step is taken into account, the employment of a photosensitive resin is more preferable.

Incidentally, with reference to FIG. 9B and FIG. 9C, a wiring pattern may be formed only in the conductor layer 130b, for instance (namely, a wiring pattern is not formed in the conductor layer 130c). Alternatively, if required, it may be constructed in such a manner that a resist layer 31 is formed on the conductor layer 130c. If it is constructed in this manner, both of the working surface and the opposite surface can be protected. In this case, the materials for the resist layer 31 to be formed on the conductor layer 130c side may be selected from any kind of material as long as they are excellent in resistance to the plating solution and can be easily removed therefrom. Namely, the material for this resist layer 31 may not necessarily be required to be the same as that of the resist layer 30 formed on the conductor layer 130b side.

Figure 9D:
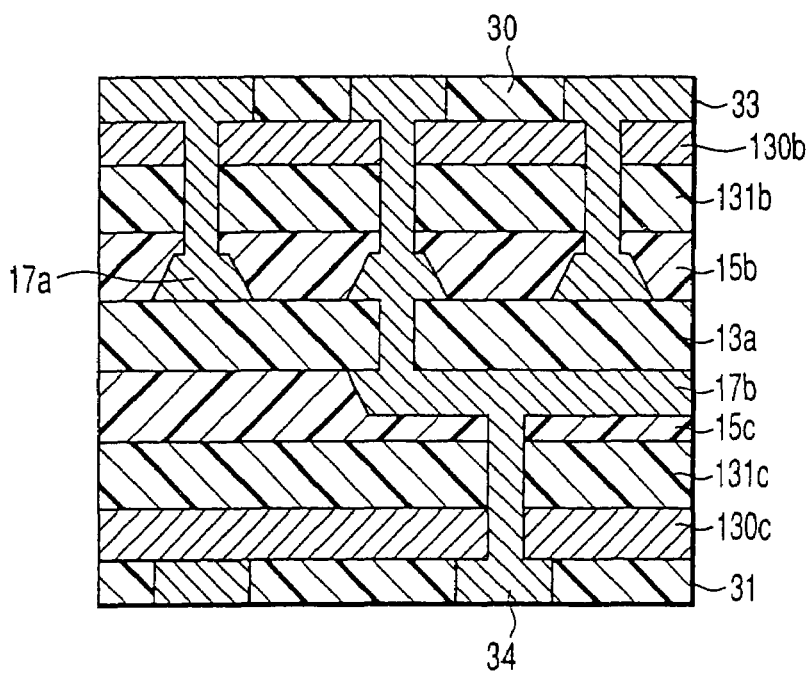

Next, as shown in FIG. 9D, an electrolytic plating is applied to the thin conductor layers 130b and 130c formed inside the openings of the resist layers 30 and 31 to thereby form deposit layers 33 and 34 having a desired film thickness. In this case, the electrolytic plating bath may preferably be formed of a filled plating bath. This filled plating bath is a kind of electrolytic plating bath wherein a polymeric surfactant, a quaternary ammonium salt and a compound having a sulfide moiety are added therein as an additive for the purpose of filling the holes of the wiring circuit board with a conductive material.

The height of plating may desirably be formed so as to make it higher than a predetermined desirable height by a height of 0.5 to 3 µm, since this deposit layer is also polished concurrently when a chemical polishing is employed in the final step of removing the thin conductor layer.

Incidentally, in order to improve the adhesive strength between the conductor layers 130b and 130c and the deposit layer, a surface treatment may preferably be performed prior to the formation of the deposit layers 33 and 34. Because if the adhesion strength between the conductor layers 130b and 130c and the deposit layer is poor, peeling may be caused to generate between the conductor layers 130b and 130c and the deposit layer as the film is rewound in the roll-to-roll process in a subsequent plating step.

The surface treatment prior to the electrolytic plating can be performed as follows for instance. Namely, the oxidized film formed on the surface of the conductor layer is removed by making use of acidic washing treatment using dilute sulfuric acid. On this occasion, when an acid cleaner comprising sulfuric acid mixed with an activating agent is employed for the removal of the residue of resist which is permitted to remain inside the openings of the resist layers 30 and 31 concurrent with the removal of the oxidized film of the conductor layers 130b and 130c, the adhesive strength of the conductor layers 130b and 130c to the deposit layer can be further enhanced. Furthermore, when the soft etching treatment is performed after the aforementioned acid washing to thereby completely remove the oxidized film of the conductor layers 130b and 130c, the adhesive strength of the conductor layers 130b and 130c to the deposit layer can be further enhanced.

According to the experiments conducted by the present inventors, it has been confirmed that when this surface treatment is performed, the generation of peeling between the deposit layer and the conductor layers 130b and 130c can be effectively prevented even if the deposit layer is formed at a current density of 1-4 A/dm$^2$ in the following deposit layer-forming step.

Figure 9E:
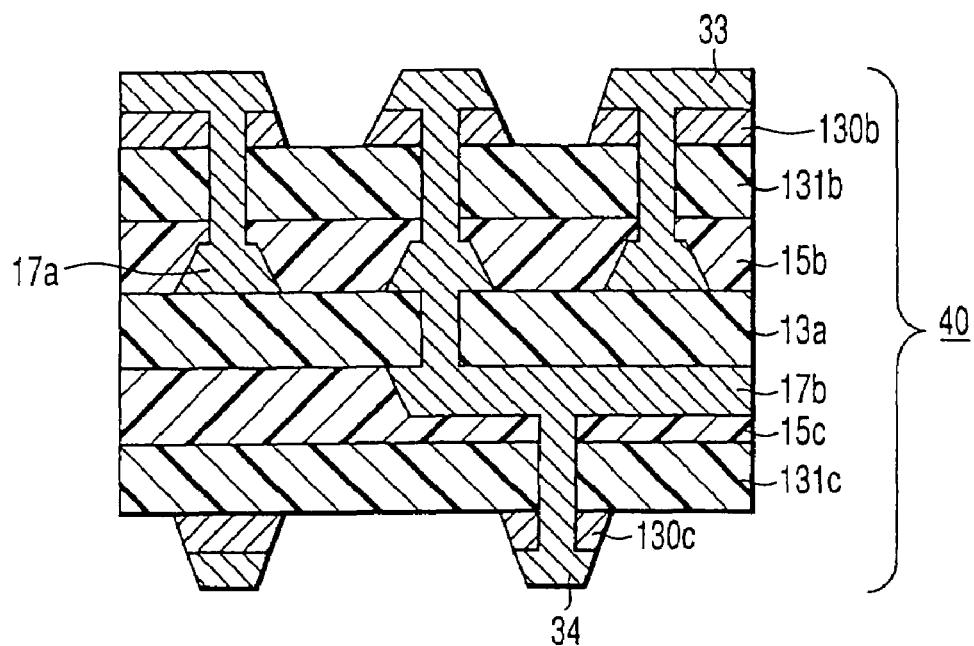

Then, the resist layers 30 and 31 are removed, and by means of the soft etching, useless portions of the thin conductor layers 130b and 130c can be removed, thereby obtaining the multi-layer circuit wiring board 40 as shown in FIG. 9E.

As the subtractive method is compared with the semi-additive method, the subtractive method is more advantageous in the respects that the number of steps can be minimized and it is easier to practice. On the other hand, the semi-additive method is more advantageous in the respect that a wiring pattern which is finer in line width can be formed as compared with the subtractive method which is highly influenced by the side etching.

By following the aforementioned manufacturing steps and by suitably changing the means of forming a wiring pattern for each layer, a multi-layer circuit wiring board having a wiring pattern of finer line-and-space can be easily obtained. Namely, the layer which necessitates the formation of a finer wiring pattern may preferably be worked by making use of the semi-additive method, and other layers which do not necessitate the formation of a finer wiring pattern may preferably be worked by making use of the subtractive method. The criterion for judging the switching of this couple of methods would be such that although it depends on the film thickness required in forming the wiring circuit, where the wiring pitch is required to be 30 µm or less for example, the employment of the semi-additive method is more preferable. Because, when the wiring pitch is required to be 30 µm or less, the working of such a fine wiring cannot be achieved by the subtractive method.

Incidentally, it is desirable, for the purpose of protecting the wiring pattern formed on the outermost surface or for the purpose of providing the wiring pattern with an excellent insulating property, to provide the outermost surface excluding the regions of outer connecting terminals with a solder mask formed of an insulating resin.

The foregoing explanations regarding the manufacturing process are directed to the manufacture of a 4-ply multi-layer circuit wiring board. If it is required to manufacture a multi-layer circuit wiring board having a larger number of layers such as a 6-ply multi-layer circuit wiring board, additional two layers can be added to the aforementioned 4-ply multi-layer circuit wiring board by making use of the aforementioned manufacturing method.

Figure 10:
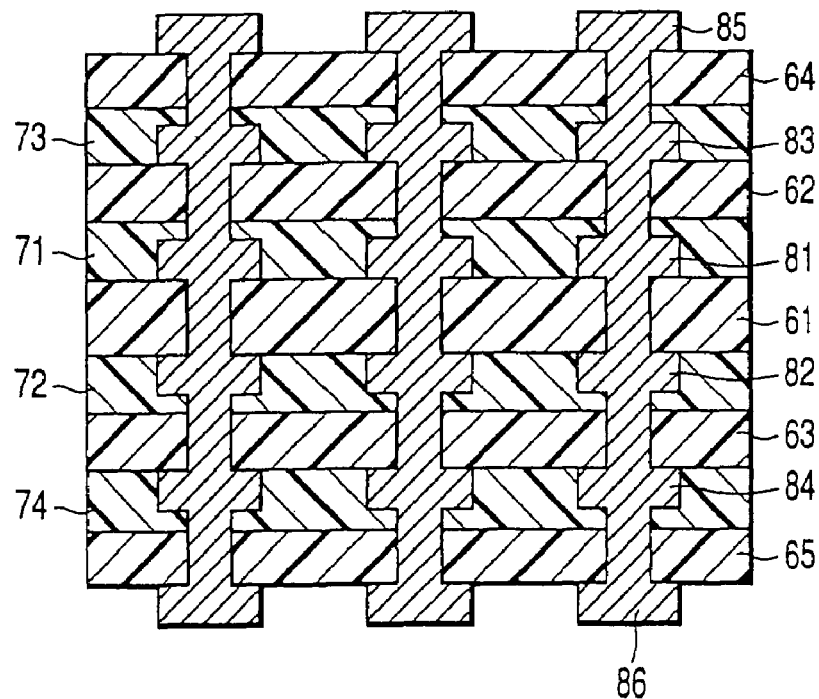
FIG. 10 is a cross-sectional view illustrating a 6-ply multi-layer circuit wiring board.

FIG. 10 shows a cross-sectional view of a 6-ply multi-layer circuit wiring board. Referring to FIG. 10, a first film 61, a second film 62, a third film 63, a fourth film 65 and a sixth film 66 are bonded together with a first adhesive layer 71, a second adhesive layer 72, a third adhesive layer 73 and a fourth adhesive layer 75 being interposed between any couple of aforementioned films. In this case, a first wiring pattern 81 is formed on the one surface of the first film 61, and a second wiring pattern 82 is formed on the other surface thereof. Further, a third wiring pattern 83 is formed on the one surface of the second film 62, a fourth wiring pattern 84 is formed on the one surface of the third film 63, a fifth wiring pattern 85 is formed on the one surface of the fourth film 65, and a sixth wiring pattern 86 is formed on the one surface of the fifth film 65.

In this manner, the 6-ply multi-layer circuit wiring board having six layers of wiring patterns 81, 82, 83, 84, 85 and 86 is constructed.

Figure 11:
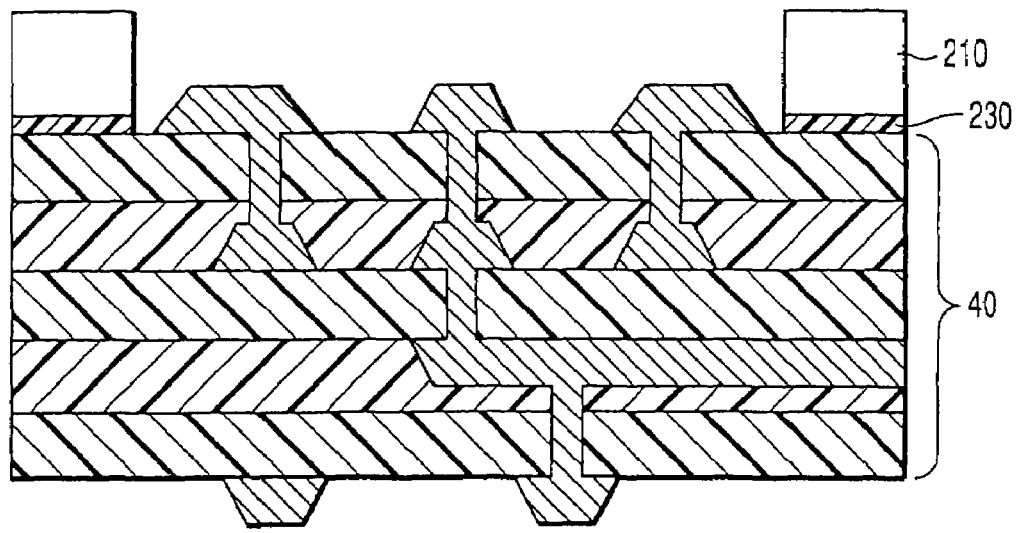
FIG. 11 is a cross-sectional view illustrating a 4-ply multi-layer circuit wiring board having a fixing frame.
Figure 12:
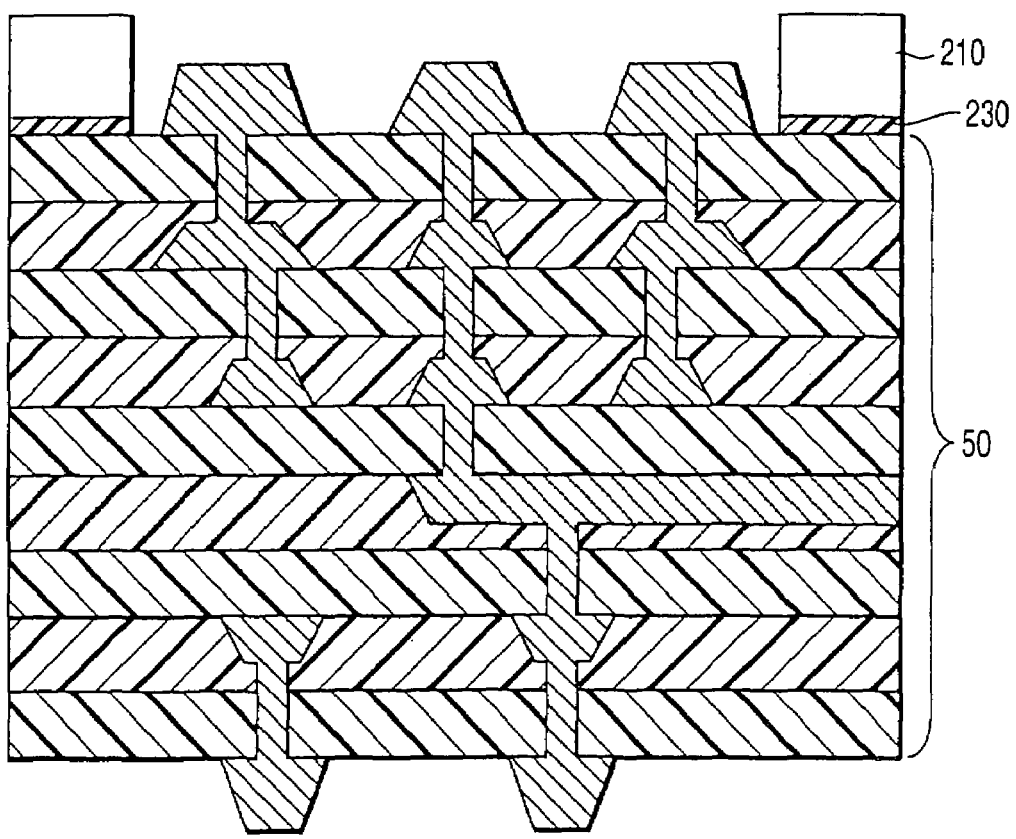
FIG. 12 is a cross-sectional view illustrating a 6-ply multi-layer circuit wiring board having a fixing frame.

FIGS. 11 and 12 illustrate respectively a multi-layer circuit wiring board provided with a fixing frame. This fixing frame can be attached via an adhesive 230 to the multi-layer circuit wiring board after accomplishing the manufacture of the multi-layer circuit wiring board. Specifically, FIG. 11 illustrates a state wherein the fixing frame is attached to a 4-ply multi-layer circuit wiring board, while FIG. 12 illustrates a state wherein the fixing frame is attached to a 6-ply multi-layer circuit wiring board.

Specific examples of the manufacturing method of the multi-layer circuit wiring board will bus explained with reference to the following three examples.

Example 1

Example 1 will be explained with reference to FIGS. 8A through 8I. This example illustrates a manufacturing example of multi-layer circuit wiring board where the subtractive method is employed.

First of all, as shown in FIG. 8A, a film 13a or a double conductor-layered polyimide tape substrate comprising a polyimide layer 131a (25 μm for example) and provided, on the opposite surfaces of the polyimide layer 131a, with conductor layers (copper foil) 130a and 132a (12 μm for example) is prepared. Then, a via-hole 190 is formed in this film 13a as shown in FIG. 8B by means of ultraviolet laser.

This via-hole 190 is then subjected to a treatment to remove dross and to a desmear treatment, which is followed by DPS and electrolytic copper plating to thereby form a via-contact layer 19a functioning to electrically connect one surface of the film 13a with the other surface thereof as shown in FIG. 8C. Incidentally, the reasons to employ the film 13a comprising a polyimide layer accompanying conductor layers (copper foil) 130a and 132a as shown herein are based on the facts that since the adhesion between a conductor layer (copper foil) and a polyimide layer is strong, the provision of rugged surface for the adhesion thereof can be omitted, that it is possible to realize excellent transmission of signals, and that it is possible to form a structure of fine wiring pattern.

Then, by means of photoetching method, the conductor layers 130a and 132a disposed on the opposite surfaces of the film 13a are patterned to form wiring patterns (wiring circuit) 17a and 17b, thereby manufacturing a substrate having a wiring pattern as shown in FIG. 8C. Incidentally, in the course of the aforementioned photoetching, alignment marks (not shown) are formed in the substrate provided with the wiring pattern. These alignment marks become a working reference in the steps of laser working and exposure to be executed in the subsequent multilayer forming process.

Then, two films 13b and 13c consisting respectively of polyimide layers 131b and 131c (for example, 13 μm in thickness) and conductor layers 130b and 130c (for example, 12 μm in thickness) which are laminated on the outer surfaces of aforementioned polyimide layers, respectively, are respectively laminated on each of the opposite surfaces of the film 13a with adhesive layers 15b and 15c being respectively interposed therebetween as shown in FIG. 8D. The lamination of these films 13b and 13c was performed as follows.

Namely, a rubber/epoxy-based adhesive layer both surfaces of which are covered respectively with a polyethylene telephthalate release film is employed and one of the release films is removed to expose a layer of adhesive agent of the adhesive layer on the occasion of adhering the adhesive layer to one of the films 13b and 13c with the layer of adhesive agent being directed to face said one of the films 13b and 13c. The resultant laminate is then subjected to a provisional press-adhesion process by making use of a laminator under the conditions of 180° C. in temperature and 3 kg/cm in pressure.

Subsequently, after the other release film has been peeled away, single conductor (copper foil)-layered polyimide tape substrates 13b and 13c are placed on the adhesive layer with the conductor layers (copper foil) 130b and 130c being respectively directed outward and subjected to a press-adhesion under heating by making use of a laminator under the conditions of 180° C. in temperature and 3 kg/cm in pressure. The aforementioned laminating steps are repeated in the lamination to the other surface of the films 13b and 13c, and the resultant laminated substrate is subjected to a thermal curing for one hour at a temperature of 150° C. The thickness of each of the adhesive layers disposed on the wiring circuits 17a and 17b is 5 μm.

Then, by making use of an ultraviolet laser beam having a wavelength of 355 nm, the multi-layered substrate shown in FIG. 8D is treated in such a manner that the conductor layers 130b and 130c; the polyimide layers 131b and 131c; and the adhesive layers 15b and 15c are subjected to the irradiation of a laser beam having an energy density of 20 J/cm², 2 J/cm² or 8 J/cm², respectively, to thereby form via-holes 192 as shown in FIG. 8E. The number of pulses irradiated are five pulses for the conductor layers 130b and 130c; ten pulses for the polyimide layers 131b and 131c; and five pulses for the adhesive layers 15b and 15c. Incidentally, the diameter of the opening of these via-holes 192 is 30 μm, the diameter of the bottom portion of these via-holes 192 is 18 μm, and hence the aspect ratio of these via-holes 192 is 0.6.

After finishing the working using the laser beam, the multi-layered substrate is subjected to chemical polishing using a 20% aqueous solution of sodium peroxodisulfate at a temperature of 30° C. to thereby remove the dross. Further, the multi-layered substrate is subjected to a desmear treatment using a 10% aqueous solution of potassium permanganate at a temperature of 70° C.

After being treated by means of DPS using a tin-palladium colloid-based catalyst, the multi-layered substrate is subjected to an electrolytic plating in an electrolytic bath comprising 225 g/L of copper sulfate, 55 g/L of sulfuric acid, 60 mg/L of chlorine ion and 20 mL of an additive, with the temperature of the bath being maintained at a temperature of 25° C. Incidentally, the liquid in the bath is stirred using a spray nozzle with a performance of 5 L/min, for instance. Subsequently, an electric current having a current density of 1 A/dm$^2$ is applied to this plating bath system to thereby perform electrolytic plating which is continued for 20 minutes or until the aspect ratio of via-holes becomes 0.3. Further, the electrolytic plating is continued at a current density of 2.5 A/dm$^2$ for 10 minutes or until the aspect ratio of via-holes becomes 0, thereby forming via-contacts 19*b* (field via) as shown in FIG. 8F.

Thereafter, a 20% aqueous solution of ammonium peroxodisulfate 30° C. in temperature is sprayed against plated copper layers 28 and 29 which have been redundantly precipitated over the conductor as a result of the plating step as shown in FIG. 8F, thereby performing a soft etching treatment for about 60 seconds for instance to reduce the thickness of the conductor layers 130*b* and 130*c* to about 9 μm for instance.

After the surface of the conductor layer is coated with a positive liquid resist by means of a roll coater, the conductor layer is subjected to a post baking treatment for 5 minutes at a temperature of 90° C. by making use of hot air and an IR drying furnace to thereby form the resist layers 30*b* and 30*c* having a thickness of 4 μm as shown in FIG. 8G.

Then, by making use of a photomask having a stripe-like circuit pattern consisting of a plurality of straight lines each having a line width of 20 μm and arrayed at a pitch of 30 μm, the resist layers 30*b* and 30*c* are subjected to a mask-contacted exposure treatment by making use of a parallel beam with a mercury lamp being employed as a light source. Subsequently, the resist layers 30*b* and 30*c* are further subjected to a spray development using an organic alkali-based developing solution for about 30 seconds to thereby remove the exposed portions of the resist layers 30*b* and 30*c* to form the openings 30*b* and 30*c* as shown in FIG. 8H.

Then, a solution of iron(III) chloride 1.36 in specific gravity and 50° C. in liquid temperature is sprayed against the resist layers 30*b* and 30*c* for about 30 seconds to perform the etching treatment of these layers, thereby forming a wiring pattern 21 over the polyimide layer 131*b* and a wiring pattern 23 over the polyimide layer 131*c*.

Finally, the substrate 111 provided with the resist layer 30 is sprayed for about 15 seconds with a 4% aqueous solution of sodium hydroxide to thereby peel off the resist layer 30, thus obtaining the multi-layer circuit wiring board 11 as shown in FIG. 8I.

The multi-layer circuit wiring board 11 obtained from the process mentioned above is provided with a stripe-like circuit pattern having a film thickness of 9 μm and consisting of a plurality of straight lines each having a line width of 15 μm and arrayed at a pitch of 30 μm. This circuit pattern can be fabricated into a desired pattern through the employment of a layout in the photolithography thereof. Further, this multi-layer circuit wiring board 11 is formed of a 4-ply circuit wiring (i.e. the pattern 21, the pattern 23, wiring patterns 17*a* and 17*b*).

The number of layers of this circuit wiring can be increased as required by repeating the aforementioned laminating process, so that it is possible to manufacture a substrate having a not less than 6-ply circuit wiring.

Incidentally, all of the steps to be executed in this embodiment (i.e. all of the steps shown in FIG. 8A through FIG. 8I) can be executed by making use of the roll-to-roll system. The reason for this is that polyimide film which is excellent in flexibility is employed herein. In the foregoing explanation, the steps of working and exposure by making use of ultraviolet laser to the opposite surfaces of substrate are sequentially performed surface by surface. However, by concurrently subjecting these opposite surfaces to all of the steps excluding the steps of working and exposure, the speed of manufacturing process can be further enhanced.

Example 2

Example 2 will be explained with reference to FIGS. 8A through 8F, and FIGS. 9A through 9E. This example illustrates a manufacturing example of multi-layer circuit wiring board where the semi-additive method is employed.

First of all, as explained with reference to FIGS. 8A through 8F, a conductor layer (copper foil) (130*b*)-attached polyimide film 13*b* is laminated via the adhesive layer 15*b* on one surface of the polyimide layer 131*a* having the wiring patterns 17*a* and 17*b* on the opposite surfaces thereof, respectively, and at the same time, a conductor layer (copper foil) (130*c*)-attached polyimide film 13*c* is laminated via the adhesive layer 15*c* on the other surface of the polyimide layer 131*a*. Thereafter, via-contact layers 19*a* and 19*b* are formed so as to electrically connect the conductor layer 130*b* with the conductor layer 130*c*. Details of treatment in each of the steps are the same as explained with reference to Example 1.

Then, as shown in FIG. 9A, an aqueous solution of sodium peroxodisulfate is sprayed against the copper layers 28 and 29 for about 120 seconds, thereby performing a soft etching treatment to reduce the thickness of the copper layers 28 and 29 to about 10 μm for instance. Incidentally, during this film-thinning treatment by means of soft etching treatment, the copper layers 28 and 29 that have been formed by means of plating can be dissolved away, and furthermore, the copper layers 130*b* and 130*c* formed of copper foil are also partially dissolved to make them thinner in film thickness.

Then, the surfaces of the copper layers 130*b* and 130*c* thus reduced in thickness are respectively laminated under heating and pressure with a 15 μm-thick negative dry film resist by means of a roll laminator, thereby forming the resist layers 30 and 31 as shown in FIG. 9B.

Then, by making use of a photomask having a stripe-like circuit pattern consisting of a plurality of straight lines each having a line width of 10 μm and arrayed at a pitch of 20 μm, the resist layers 30 and 31 are subjected to a mask-contacted exposure treatment by making use of a parallel beam with a mercury lamp being employed as a light source. Subsequently, the resist layers 30 and 31 are further subjected to a developing treatment using a 1% sodium carbonate solution to thereby remove the unexposed portions of the resist layers to form the openings 32*b* and 32*c* as shown in FIG. 9C.

Then, by making use of an acidic cleaner, the resultant surface is acid-washed under the conditions of: 40° C. in temperature and 4 minutes in washing time, which is followed by a soft etching treatment wherein an aqueous solution of sodium peroxodisulfate is sprayed against the surface for about 15 seconds, thereby performing a chemical polishing of the exposed surfaces of the conductor layers (copper foil) 130*b* and 130*c*.

Then, an electrolytic copper plating for forming a wiring on the surface of the thin film conductor layer provided inside the openings 32*b* and 32*c* of the resist layers 30 and 31 is performed for 10 minutes at a current density of 2 A/dm$^2$ to thereby form copper plate layers 33 and 34 each having a thickness of 10 μm as shown in FIG. 9D.

Then, the substrate is sprayed for about 30 seconds with a 5% aqueous solution of sodium hydroxide to thereby peel off the resist layers 30 and 31.

Finally, an aqueous solution of sodium peroxodisulfate is sprayed against the resultant surface for 90 seconds to perform the soft etching treatment thereof to thereby remove the redundant portions of the conductor layers 130b and 130c where the copper plating layers 33 and 34 are not formed.

As a result of aforementioned steps, it is found possible to obtain a multi-layer circuit wiring board 40 provided with a stripe-like circuit pattern consisting of a plurality of straight lines each having a line width of 10 μm and arrayed at a pitch of 20 μm as shown in FIG. 9E.

This multi-layer circuit wiring board is provided with almost the same features as that of the multi-layer circuit wiring board 11 described in Example 1 in the respects that the pattern of each of wiring circuits can be optionally selected, that it is possible to further increase the number of layers, that it can be manufactured by way of the roll-to-roll system, that the opposite surfaces of substrate can be concurrently treated in all of the steps excluding the steps of working and exposure wherein the opposite surfaces of substrate is required to be individually or separately treated.

Example 3

Example 3 will be explained with reference to FIGS. 13A through 13C. This example illustrates a manufacturing example of a multi-layer circuit wiring board 50 having a 6-ply circuit wiring wherein the subtractive method and the semi-additive method are combined.

Figure 13A:
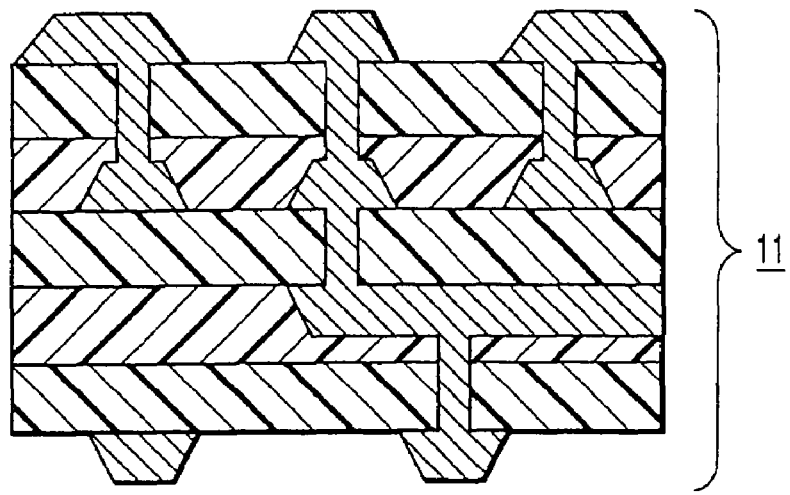
FIGS. 13A through 13G represent respectively a cross-sectional view illustrating a method of manufacturing a multi-layer circuit wiring board according to Example 3.

First of all, by the same method as explained in Example 1, there is fabricated, as shown in FIG. 13A, a multi-layer circuit wiring board 11 formed of a 4-ply circuit substrate which is provided with a stripe-like wiring pattern consisting of a plurality of straight lines each having a line width of 15 μm and arrayed at a pitch of 30 μm.

Figure 13B:
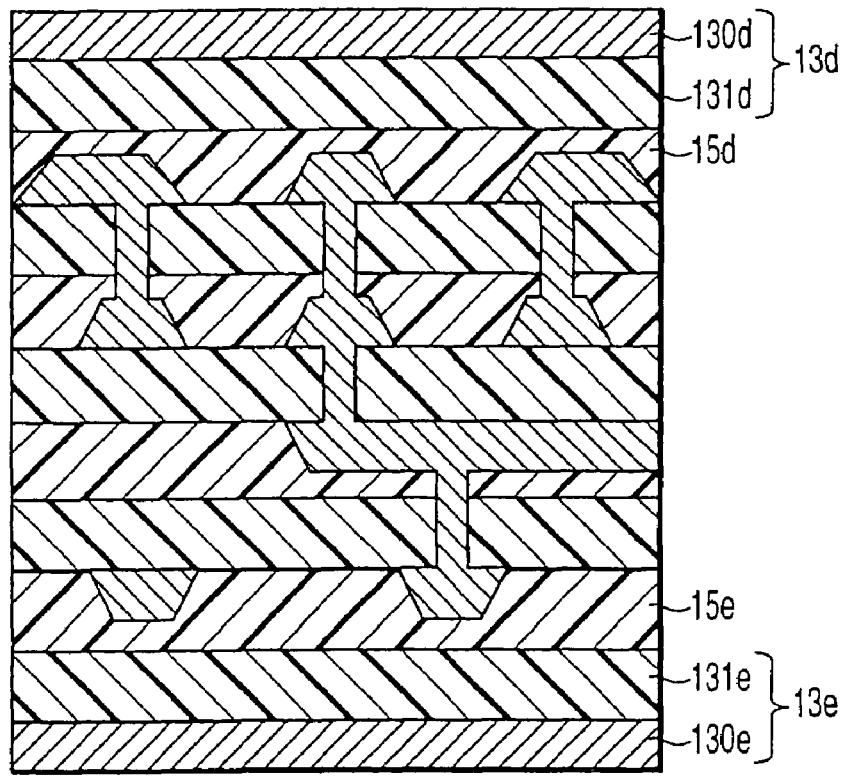

Then, as shown in FIG. 13B, a film 13d comprising a conductor layer (copper foil) 130d and a polyimide film 131d is laminated via the adhesive layer 15d on one surface of the multi-layer circuit wiring board 11, and at the same time, a film 13e comprising a conductor layer (copper foil) 130e and a polyimide film 131e is laminated via the adhesive layer 15e on the other surface of the multi-layer circuit wiring board 11.

Figure 13C:
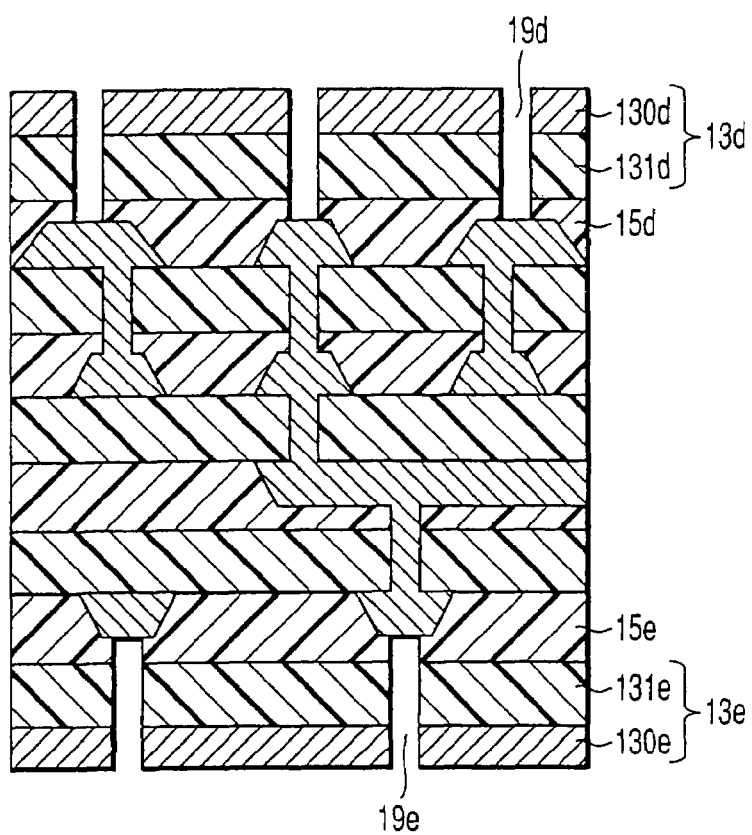
Figure 13D:
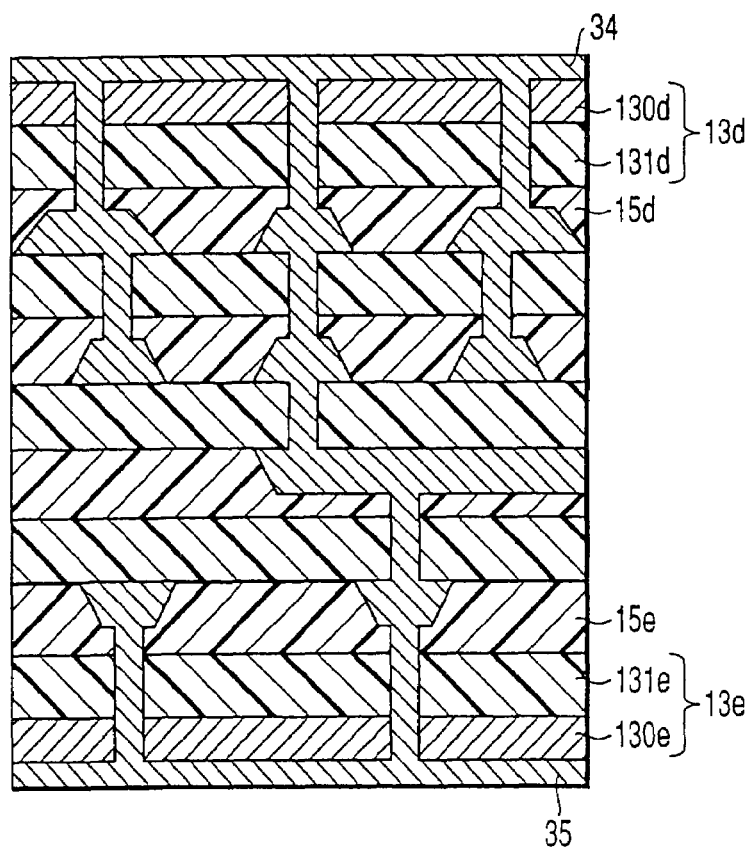
Figure 13E:
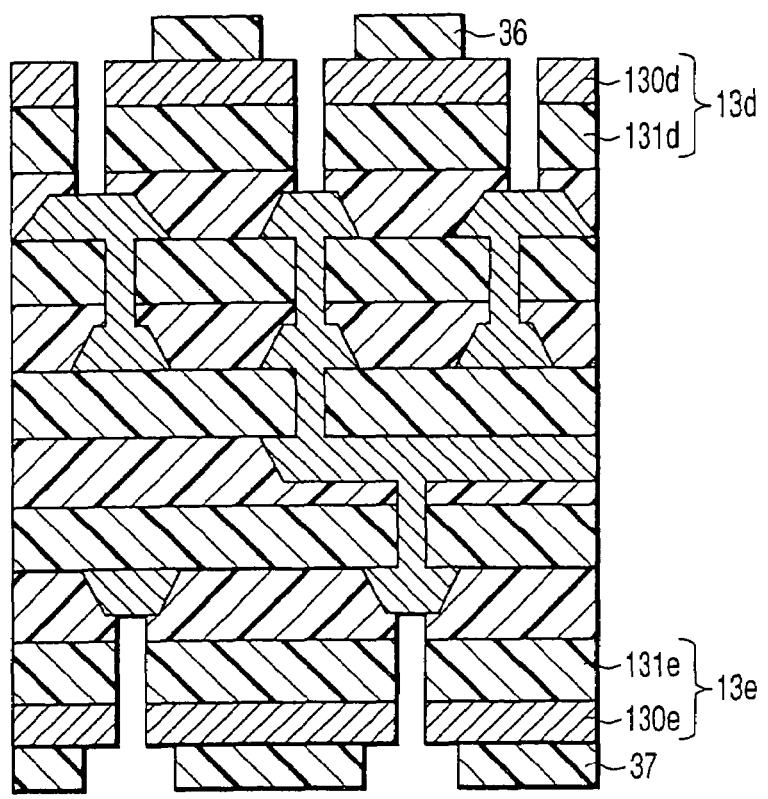
Figure 13F:
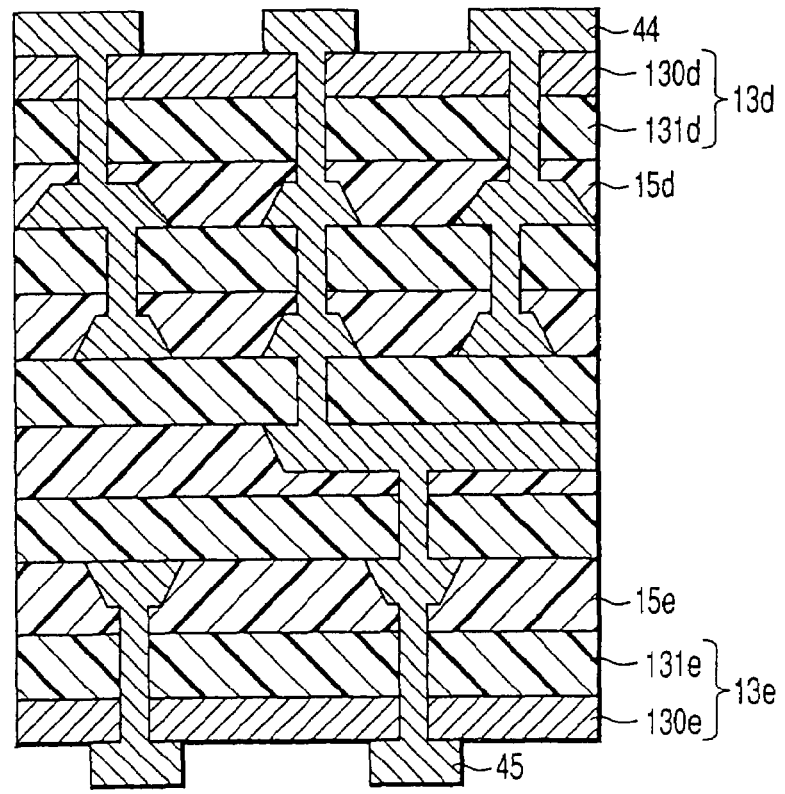

Subsequently, as shown in FIG. 13C, in the same manner as explained in Example 1, a via-hole 19d is formed in the film 13d, and a via-hole 19e is formed in the film 13e. Thereafter, as shown in FIGS. 13D through 13F, in the same manner as explained in Example 2, plated layers 44 and 45 are formed. Namely, as shown in FIG. 13D, copper layers 34 and 35 are formed by means of electrolytic plating, and by way of a soft etching treatment, the film thickness of these copper layers 34 and 35 is reduced. Then, as shown in FIG. 13E, resist patterns 36 and 37 are formed on the surfaces of copper layers 34 and 35. Then, as shown in FIG. 13F, deposit layers 44 and 45 are formed by way of an electrolytic plating.

Figure 13G:
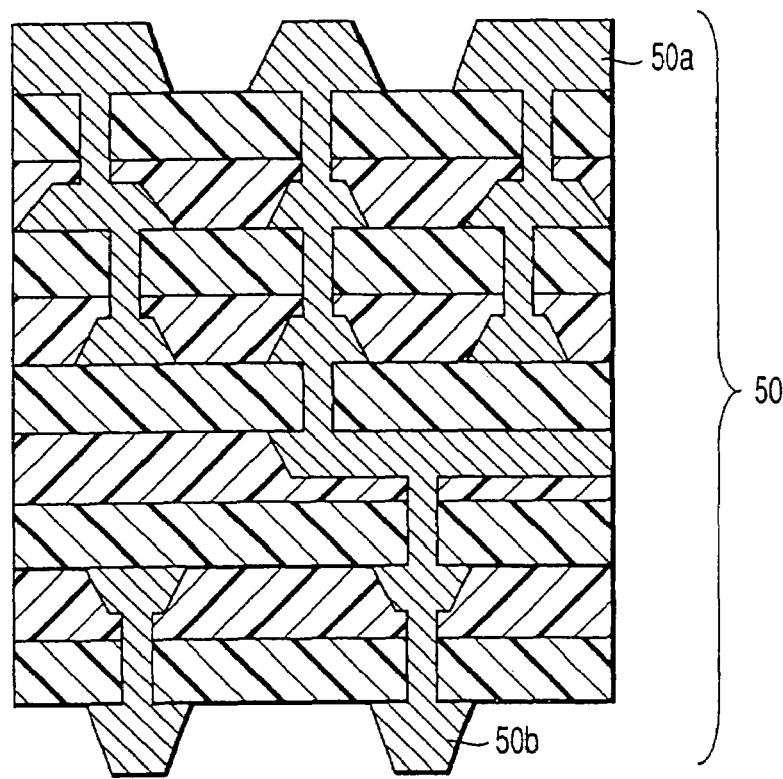

By finishing each of the aforementioned steps, it is now possible to manufacture the multi-layer circuit wiring board 50 formed of a 6-ply circuit substrate which is provided with stripe-like wiring patterns 50a and 50b consisting of a plurality of straight lines each having a line width of 10 μm and arrayed at a pitch of 20 μm as shown in FIG. 13G.

In the manufacture of this multi-layer circuit wiring board 50 also, it is possible to provide almost the same features as that of the multi-layer circuit wiring board 11 described in Example 1 in the respects that the pattern of each of wiring circuits can be optionally selected, that it is possible to further increase the number of layers, that it can be manufactured by way of the roll-to-roll system, that the opposite surfaces of substrate can be concurrently treated in all of the steps excluding the steps of working and exposure wherein the opposite surfaces of substrate is required to be individually or separately treated.

As shown in FIG. 12, a fixing frame 210 which has been produced through the etching of a copper plate having a thickness of 0.5 mm and made into a predetermined configuration can be adhered onto the wiring board, thereby making it possible to manufacture a fixing frame-attached multi-layer circuit wiring board.

Example 4

Example 4 will be explained with reference to FIGS. 14A through 14L. This example illustrates a manufacturing example of a multi-layer circuit wiring board wherein a composite film comprising a couple of insulating layers with a conductor layer being interposed therebetween is employed and the composite film is successively laminated one upon another, thereby forming the multi-layer circuit wiring board. The materials and dimensions of each layer, as well as the conditions for each of the treatments and each of the steps are the same as those of Examples 1 to 3.

Figure 14A:
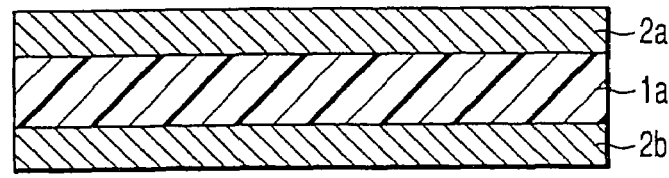
Figure 14B:
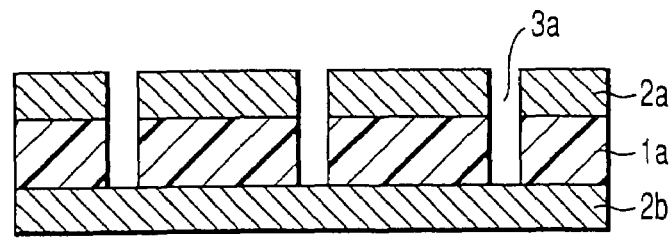
Figure 14C:
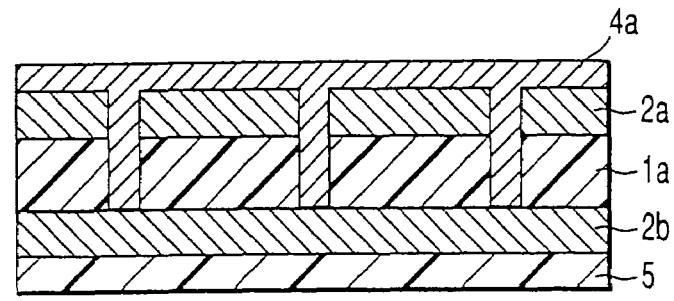

A shown in FIG. 14A, a film substrate comprising an insulating layer 1a which is sandwiched between a couple of conductor layers 2a and 2b is prepared. Then, as shown in FIG. 14B, via-holes 3a are formed in this film substrate by means of laser working. Thereafter, as shown in FIG. 14C, one surface of the conductor layer 2b is laminated and protected with a resist layer 5 and then the film substrate is subjected to a desmear treatment so as to remove any residue that might have been generated on the occasion of forming the via-holes. Thereafter, the film substrate is subjected to a conductivity-providing treatment and then to an electrolytic plating to thereby fill the via-holes 3a with a metal to form a deposit layer 4a.

Figure 14D:
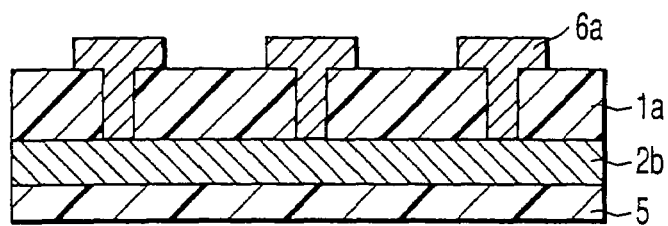

Then, this deposit layer 4a is subjected to a chemical polishing to reduce the thickness thereof to the range of 3 to 12 μm and at the same time, the non-uniformity in film thickness of the conductor body comprising a conductor layer 2a and the deposit layer 4a is minimized to 20% or less. Thereafter, by making use of a resist pattern (not shown) as a mask, the conductor body is subjected to an etching treatment to thereby selectively remove useless portions of the conductor layer, thus forming a wiring layer 6a having a predetermined pattern as shown in FIG. 14D.

Figure 14E:
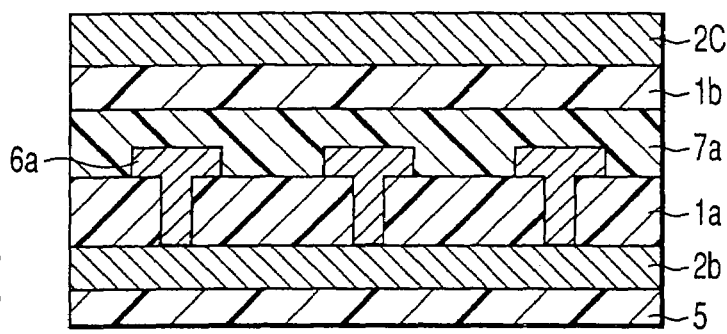
Figure 14F:
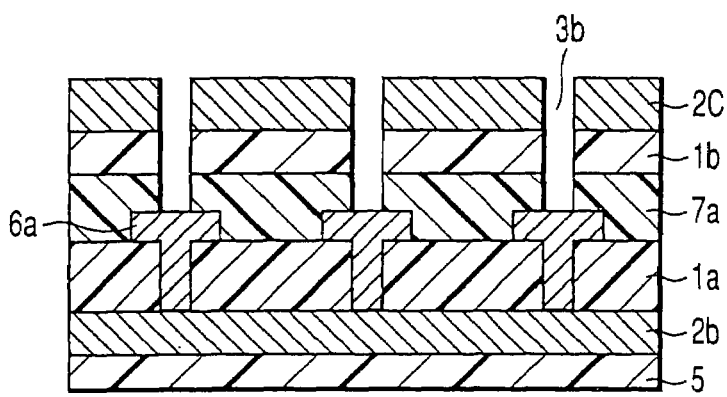

Subsequently, as shown in FIG. 14E, an adhesive layer 7a is laminated on one of the opposite surfaces of the insulating layer 1a having a wiring pattern 6a formed thereon, and an adhesive film comprising an insulating layer 1b laminated with a conductor layer 2c is laminated on the other surface of the opposite surfaces of the insulating layer 1a with the conductor layer 2c being directed outside of the laminate. Next, as shown in FIG. 14F, via-holes 3b are formed in this adhesive film by means of laser working.

Figure 14G:
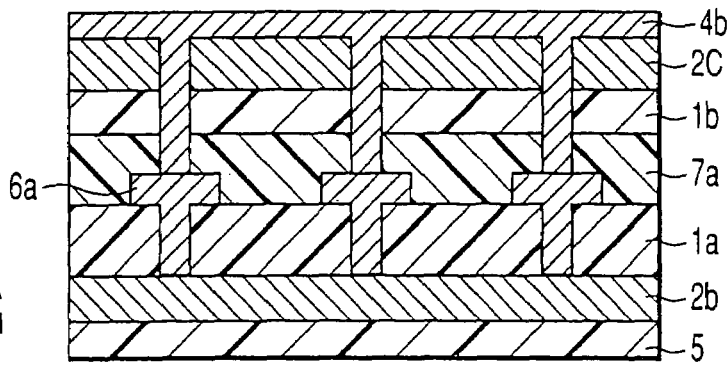

Thereafter, the resultant laminate is subjected to a desmear treatment so as to remove any residue that might have been generated on the occasion of forming the via-holes. Thereafter, the laminate is subjected to a conductivity-providing treatment and then to an electrolytic plating to thereby fill the via-holes 3b with a metal to form a deposit layer 4b as shown in FIG. 14G. Then, this deposit layer 4b is subjected to a chemical polishing to reduce the thickness thereof to the range of 3 to 12 μm and at the same time, the non-uniformity in film thickness of the conductor body comprising a conductor layer 2c and the deposit layer 4b is minimized to 20% or less. Thereafter, by making use of a resist pattern (not shown) as a mask, the conductor body is subjected to an etching treatment to thereby selectively remove useless portions of the conductor layer, thus forming a wiring layer 6b having a predetermined pattern as shown in FIG. 14H.

Subsequently, as shown in FIG. 14I, an adhesive layer 7b is laminated on one of the opposite surfaces of the insulating layer 1b having a wiring pattern 6b formed thereon, and an adhesive film comprising an insulating layer 1c laminated with a conductor layer 2d is laminated on the other surface of the opposite surfaces of the insulating layer 1b with the conductor layer 2d being directed outside of the laminate. Next, as shown in FIG. 14J, via-holes 3c are formed in this adhesive film by means of laser working.

Figure 14K:
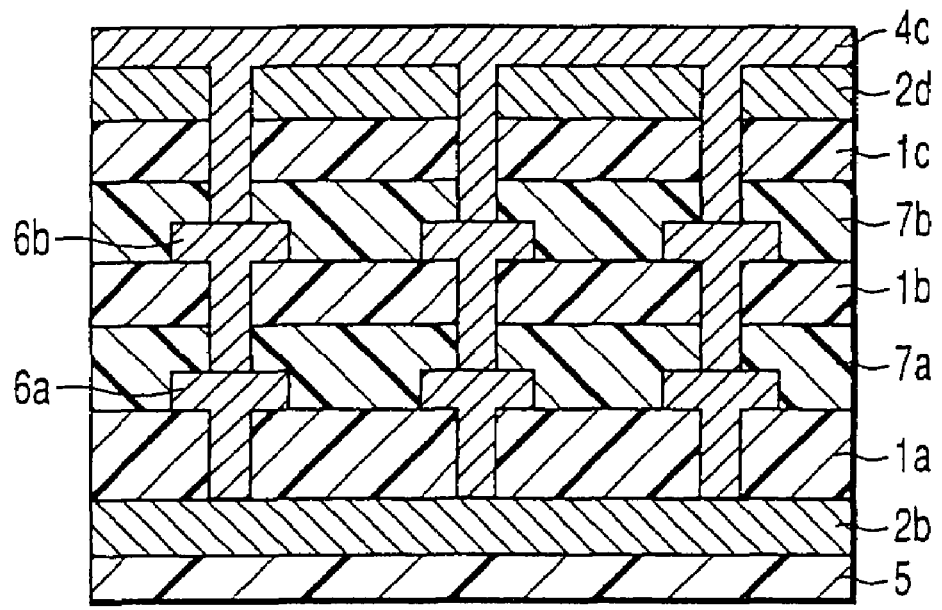
Figure 14L:
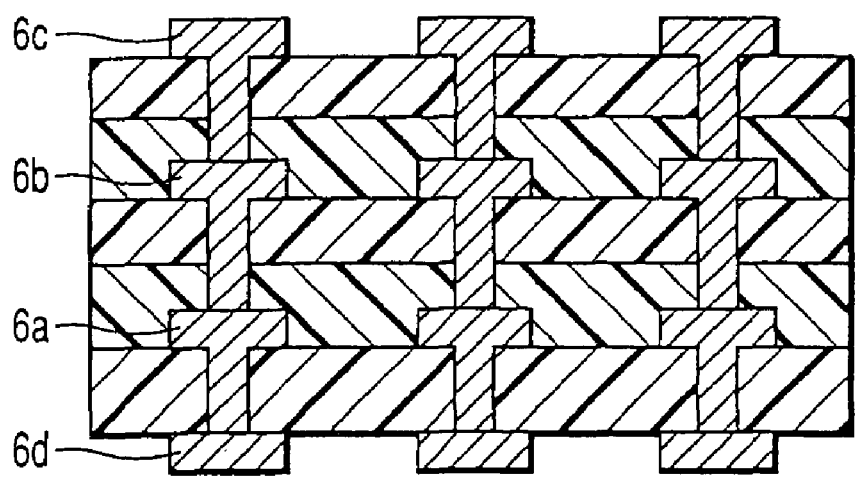

Thereafter, the resultant laminate is subjected to a desmear treatment so as to remove any residue that might have been generated on the occasion of forming the via-holes. Thereafter, the laminate is subjected to a conductivity-providing treatment and then to an electrolytic plating to thereby fill the via-holes 3c with a metal to form a deposit layer 4c as shown in FIG. 14K. Then, after the resist film 5 functioning as a protective layer is removed, the conductor layer 2b and the deposit layer 4c are subjected to a chemical polishing to respectively reduce the thickness thereof to the range of 3 to 12 μm and at the same time, the non-uniformity in film thickness of the conductor body is minimized to 20% or less. Thereafter, by making use of a resist pattern (not shown) as a mask, the conductor body is subjected to an etching treatment to thereby selectively remove useless portions of the conductor layer, thus forming, as shown in FIG. 14L, wiring layers 6c and 6d each having a predetermined pattern.

When the steps described above are performed based on the roll-to-roll system, the multi-layer circuit wiring board can be efficiently mass-produced.

According to the construction of the present invention, it is now possible to obtain the following advantages.

The multi-layer circuit wiring board to be obtained according to this embodiment is constituted by a lamination of films comprising, for example, a polyimide layer functioning as an insulating layer, and copper foil functioning as a conductor layer. Therefore, the adhesion between the insulating layer and the conductor layer is very strong, and the irregularities for generating an anchoring effect are extremely minimal. As a result, it is possible to sustain the linearity of the wiring pattern, and to prevent non-uniformity from developing in lateral direction, thereby making it possible to realize an enhanced speed in transmitting signals at a high density.

The multi-layer circuit wiring board to be obtained according to this embodiment is formed of a laminate of films each excellent in flexibility. Accordingly, it is possible to adopt a roll-to-roll technique which is designed to continuously manufacture a multi-layer circuit wiring board by making use of a long strip of base material, and hence the multi-layer circuit wiring board according to this embodiment is suited in realizing the mass-production thereof.

For example, when a film consisting of a polyimide layer and copper foil is employed, a wiring pattern having a fine line-and-space can be easily formed. Accordingly, it is now possible to reduce the number of layers to be laminated as compared with the conventional multi-layer circuit wiring board. As a result, an IC package which is highly miniaturized can be easily mass-produced.

Although the present invention has been explained on the basis of specific examples in the foregoing description, it would be obvious to a person skilled in the art to variously modify and change the present invention within the scope of the idea of the present invention. Therefore, it may be understood that these modifications and changes will fall within the scope of the present invention. Further, each of embodiments disclosed herein may be executed by suitably combining them in any possible manner to thereby obtain the effects of such combinations. Further, the aforementioned embodiments include inventions of various stages and hence it may be possible to derive various inventions through the combinations of such inventions. For example, even if some constituent elements is eliminated from the entire constituent elements disclosed in these embodiments, if any of the objects set forth in the column of object can be solved by such a construction, and if it is possible, by such a construction, to derive at least one of the effects set forth in the column of the effects of the invention, the construction may be considered to fall within the scope of the present invention.

According to the manufacturing method of the multi-layer circuit wiring board as set forth by the present invention, it is possible to provide a multi-layer circuit wiring board and an IC package, each provided with a wiring pattern having a fine line-and-width and suited for the mass-production thereof, and to provide a manufacturing method of such a multi-layer circuit wiring board.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of manufacturing a multi-layer circuit wiring board, said method comprising:

forming a first via-contact hole in a first film having a first conductor layer formed on one surface thereof and a second conductor layer formed on another surface thereof, by using a laser beam, said first via-contact hole passing through the first conductor layer and first film and not passing through the second conductor layer;

performing an electrolytic plating to bury the first via-contact hole with a metal thus forming a first via-contact layer electrically connecting said first conductor layer with said second conductor layer;

forming a first wiring pattern in said first conductor layer, and forming a second wiring pattern in said second conductor layer;

laminating a second film having a first insulating layer and a third conductor layer formed on said first insulating layer on said one surface of said first film in such a manner that said first insulating layer is in contact with said one surface of said first film, after that or simultaneously laminating a third film having a second insulating layer and a fourth conductor layer formed on said second insulating layer on the other surface of said first film in such a manner that said second insulating layer is in contact with said other surface of said first film;

forming a second via-contact hole in said second film, by using a laser beam, said second via-contact hole passing through the third conductor layer and first insulating film and reaching the first wiring pattern;

forming a third via-contact hole in a third film, by using a laser beam, said third via-contact hole passing through the fourth conductor layer and second insulating film and reaching the second wiring pattern;

performing an electrolytic plating to bury the second via-contact hole and third via-contact hole with a metal thus forming a second via-contact layer electrically connecting said first wiring pattern with said third conductor layer, and third via-contact layer electrically connecting said second wiring pattern with said fourth conductor layer;

forming a third wiring pattern for mounting an IC on said third conductor layer; and forming a fourth wiring pattern to be electrically connected with a printed wiring board on said fourth conductor layer.

2. The method according to claim 1, wherein a roll-to-roll technique is employed for a formation of said first and second wiring patterns, for a formation of said first via-contact layer, for a lamination of said second film onto said first film, for a lamination of said third film onto said first film, for a formation of a wiring pattern for mounting said IC, for a formation of a wiring pattern to be electrically connected with said printed wiring board, for a formation of said second via-contact layer, and for a formation of said third via-contact layer.

3. The method according to claim 1, wherein said first, second and third via-contact layers are respectively formed by a procedure where an ultraviolet laser having a wavelength of third harmonics or more is employed to form a via-hole, and scattered metal particles deposited at an edge of opening of said via-hole are removed by making use of at least one method selected from a physical polishing using said ultraviolet laser, a physical polishing using abrasive grains, and a chemical polishing by way of acid treatment, thereby obtaining said via-hole having an aspect ratio of 1.5 or less.

4. The method according to claim 1, wherein said first, second and third via-contact layers are respectively formed by a procedure where an ultraviolet laser having a wavelength of third harmonics or more is employed to form a via-hole, and scattered metal particles deposited at an edge of opening of said via-hole are removed by making use of a physical polishing using said ultraviolet laser, wherein at least one method selected from a physical polishing using abrasive grains, and a chemical polishing using acid treatment is employed before or after the first-mentioned physical polishing to polish said first, second, third and fourth conductor layers until the aspect ratio of said via-hole becomes 1.5 or less.

5. The method according to claim 1, wherein said first, second and third via-contact layers are respectively formed by a procedure wherein an ultraviolet laser having a wavelength of third harmonics or more is employed to form a via-hole, residues generated in the formation of said via-hole are removed by making use of a desmear treatment, the holes to be used for forming said via-contact layer is treated to provide the holes with conductivity, and said holes are subjected to an electrolytic plating to form said via-contact layer.

6. The method according to claim 1, wherein said first, second and third via-contact layers are respectively formed by a procedure wherein an ultraviolet laser having a wavelength of third harmonics or more is employed to form a blind via-hole, and residues generated in the formation of said via-hole are removed by making use of a desmear treatment using permanganate.

7. The method according to claim 6, wherein said desmear treatment is followed by a treatment to provide said via-hole with conductivity by means of a direct plating system using at least one material selected from the group consisting of a tin-palladium colloid-based catalyst, a conductive polymer and carbon graphite.

8. The method according to claim 6, wherein said desmear treatment is followed by an electroless copper plating to provide said via-hole with conductivity.

9. The method according to claim 1, wherein said first, second and third via-contact layers are respectively formed by a procedure wherein an ultraviolet laser having a wavelength of third harmonics or more is employed to form a blind via-contact layer-forming hole, residues generated in the formation of said blind via-contact layer-forming hole are removed by making use of a desmear treatment using permanganate, said via-hole is treated using a tin-palladium-based catalyst to provide said via-hole with conductivity or said via-hole is subjected to electroless plating to provide said via-hole with conductivity, and said via-hole is subjected to electrolytic plating using two or more stages of electric density to thereby fill the interior of said blind via-contact layer-forming hole with a metal.

10. The method according to claim 1, wherein the formation of a wiring pattern in said first conductor layer, the formation of a wiring pattern in said second conductor layer, the formation of a wiring pattern in said third conductor layer and the formation of a wiring pattern in said fourth conductor layer are formed by a procedure wherein said first, second, third and fourth conductor layers are respectively chemically polished to confine the thickness thereof to fall within the range of 3 to 12 $\mu$m and to confine non-uniformity in thickness of each of these conductor layers to fall within 20% or less of the thicknesses of said first, second, third and fourth conductor layers, and redundant portions of said first, second, third and fourth conductor layers are selectively removed by means of etching treatment using a resist to thereby form predetermined wiring patterns in said first, second, third and fourth conductor layers.

11. The method according to claim 1, wherein the formation of a wiring pattern in said first conductor layer, the formation of a wiring pattern in said second conductor layer, the formation of a wiring pattern in said third conductor layer and the formation of a wiring pattern in said fourth conductor layer are formed by a procedure wherein said first, second, third and fourth conductor layers are respectively chemically polished to confine the thickness thereof to fall within the range of 0.5 to 3 $\mu$m and to confine non-uniformity in thickness of each of these conductor layers to fall within 20% or less of the thicknesses of said first, second, third and fourth conductor layers, and said first, second, third and fourth conductor layers are respectively selectively subjected to plating using a resist to form a predetermined pattern, which is followed by chemical polishing of said first, second, third and fourth conductor layers to thereby remove portions thereof other than the plated portions thereof, thereby forming predetermined wiring patterns in said first, second, third and fourth conductor layers.

12. The method according to claim 11, wherein said plating is performed by a process wherein said conductor layers are subjected to acid washing treatment after the formation of said resist, and then subjected to Cu-plating at a current density of 1 to 4 A/dm$^2$.

13. A method of manufacturing a multi-layer circuit wiring board, said method comprising:

forming a first via-contact hole in a first film having a first conductor layer formed on one surface thereof and a second conductor layer formed on another surface thereof, by using a laser beam, said first via-contact hole passing through the first conductor layer and first film and not passing through the second conductor layer;

performing an electrolytic plating to bury the first via-contact hole with a metal thus forming a first via-contact layer electrically connecting said first conductor layer with said second conductor layer;

forming a first wiring pattern in said first conductor layer, and forming a second wiring pattern in said second conductor layer;

laminating a second film having a first insulating layer and a third conductor layer formed on said first insulating layer on said one surface of said first film in such a manner that said first insulating layer is in contact with said one surface of said first film, after that or simultaneously laminating a third film having a second insulating layer and a fourth conductor layer formed on said second insulating layer on the other surface of said first film in such a manner that said second insulating layer is in contact with said other surface of said first film;

forming a second via-contact hole in a second film, by using a laser beam, said second via-contact hole passing through the third conductor layer and first insulating film and reaching the first wiring pattern;

forming a third via-contact hole in a third film, by using a laser beam, said third via-contact hole passing through the fourth conductor layer and second insulating film and reaching the second wiring pattern;

performing an electrolytic plating to bury the second via-contact hole and third via-contact hole with a metal thus forming a second via-contact layer electrically connecting said first wiring pattern with said third conductor layer, and third via-contact layer electrically connecting said second wiring pattern with said fourth conductor layer;

forming third and fourth wiring patterns respectively in said third conductor layer and in said fourth conductor layer;

laminating a fourth film over said wiring pattern of said third conductor layer, said fourth film having a third insulating layer and a fifth conductor layer formed on said third insulating layer, after that or simultaneously laminating a fifth film over said wiring pattern of said fourth conductor layer, said fifth film having a fourth insulating layer and a sixth conductor layer formed on said fourth insulating layer;

forming a fourth via-contact hole in a fourth film, by using a laser beam, said fourth via-contact hole passing through the fifth conductor layer and third insulating film and reaching the third wiring pattern:

forming a fifth via-contact hole in a fifth film, by using a laser beam, said fifth via-contact hole passing through the sixth conductor layer and fourth insulating film and reaching the fourth wiring pattern;

performing an electrolytic plating to bury the fourth via-contact hole and fifth via-contact hole with a metal thus forming a fourth via-contact layer and fifth via-contact layer;

forming a wiring pattern for mounting an IC on one of said fifth conductor layer and sixth conductor layer; and forming another wiring pattern to be electrically connected with a printed wiring board on another one of said fifth conductor layer and sixth conductor layer.

14. The method according to claim 13, wherein the formation of a wiring pattern in said first conductor layer, in said second conductor layer, in said third conductor layer, in said fourth conductor layer, in said fifth conductor layer and in said sixth conductor layer is performed by a procedure wherein with respect to a fine pattern-forming region of layer where a wire-working pitch of fine wiring pattern is finer than 30 µm, these conductor layers are respectively chemically polished to confine the thickness thereof to fall within the range of 0.5 to 3 µm and to confine non-uniformity in thickness of said fine pattern-forming region of layer to fall within 20% or less, and said fine pattern-forming region of layer is selectively subjected to plating using a resist to form a predetermined pattern, which is followed by chemical polishing thereof to thereby remove portions other than the plated portions thereof, thereby forming predetermined wiring patterns in said fine pattern-forming region of layer; and with respect to a residual region of layer other than said fine pattern-forming region of layer, these conductor layers are respectively chemically polished to confine the thickness thereof to fall within the range of 3 to 12 µm and to confine non-uniformity in thickness of said residual region of layer to fall within 20% or less, and said residual region of layer is selectively subjected to etching using a resist to remove redundant portions thereof, thereby forming predetermined wiring patterns in said residual region of layer.

15. A method of manufacturing a multi-layer circuit wiring board, said method comprising:
(a) forming a first via-contact hole in a first film having a first conductor layer formed on one surface thereof and a second conductor layer formed on another surface thereof, by using a laser beam, said first via-contact hole passing through the first conductor layer and first film and not passing through the second conductor layer, and performing an electrolytic plating to bury the first via-contact hole with a metal thus forming a first via-contact layer;
(b) forming a first wiring pattern in said first conductor layer, and forming a second wiring pattern in said second conductor layer;
(c) laminating a second film having a first insulating layer and a third conductor layer formed on said first insulating layer on said one surface of said first film in such a manner that said first insulating layer is in contact with said one surface of said first film, after that or simultaneously laminating a third film having a second insulating layer and a fourth conductor layer formed on said second insulating layer on the other surface of said first film in such a manner that said second insulating layer is in contact with said other surface of said first film;
(d) forming a second via-contact hole in a second film, by using a laser beam, said second via-contact hole passing through the third conductor layer and first insulating film and reaching the first wiring pattern;
(e) forming a third via-contact hole in a third film, by using a laser beam, said third via-contact hole passing through the fourth conductor layer and second insulating film and reaching the second wiring pattern;
(f) performing an electrolytic plating to bury the second via-contact hole and third via-contact hole with a metal thus forming a second via-contact layer electrically connecting said first wiring pattern with said third conductor layer, and third via-contact layer electrically connecting said second wiring pattern with said fourth conductor layer;
(g) forming third and fourth wiring patterns respectively in said third conductor layer and in said fourth conductor layer;
(h) laminating a fourth film over said wiring pattern of said third conductor layer, said fourth film having a third insulating layer and a fifth conductor layer formed on said third insulating layer, after that or simultaneously laminating a fifth film over said wiring pattern of said fourth conductor layer, said fifth film having a fourth insulating layer and a sixth conductor layer formed on said fourth Insulating layer;
(i) forming a fourth via-contact hole in a fourth film, by using a laser beam, said fourth via-contact hole passing through the fifth conductor layer and third insulating film and reaching the third wiring pattern;
(j) forming a fifth via-contact hole in a fifth film, by using a laser beam, said fifth via-contact hole passing through the sixth conductor layer and fourth insulating film and reaching the fourth wiring pattern;

(k) performing an electrolytic plating to bury the fourth via-contact hole and fifth via-contact hole with a metal thus forming a fourth via-contact layer electrically connecting said third wiring pattern with said fifth conductor layer, and fifth via-contact layer electrically connecting said fourth wiring pattern with said sixth conductor layer; and repeating said steps (g) through (k) to thereby form a required number of layers to form a laminate; forming a wiring pattern for mounting an IC on an outermost conductor layer which is disposed on one surface of said laminate; and forming another wiring pattern to be electrically connected with a printed wiring board on another outermost conductor layer which is disposed on the other surface of said laminate.

16. The method according to claim 15, wherein the formation of a wiring pattern in each of these conductor layers is performed by a procedure wherein with respect to a fine pattern-forming region of layer where a wire-working pitch of fine wiring pattern is finer than 30 μm, these conductor layers are respectively chemically polished to confine the thickness thereof to fall within the range of 0.5 to 3 μm and to confine non-uniformity in thickness of said fine pattern-forming region of layer to fall within 20% or less, and said fine pattern-forming region of layer is selectively subjected to plating using a resist to form a predetermined pattern, which is followed by chemical polishing thereof to thereby remove portions other than the plated portions thereof, thereby forming predetermined wiring patterns in said fine pattern-forming region of layer; and with respect to a residual region of layer other than said fine pattern-forming region of layer, these conductor layers are respectively chemically polished to confine the thickness thereof to fall within the range of 3 to 12 μm and to confine non-uniformity in thickness of said residual region of layer to fall within 20% or less, and said residual region of layer is selectively subjected to etching using a resist to remove redundant portions thereof, thereby forming predetermined wiring patterns in said residual region of layer.

17. A method of manufacturing a multi-layer circuit wiring board, said method comprising:

forming a first via-contact hole in a first film having a first conductor layer formed on one surface thereof and a second conductor layer formed on another surface thereof, by using a laser beam, said first via-contact hole passing through the first conductor layer and first film and not passing through the second conductor layer;

performing an electrolytic plating to bury the first via-contact hole with a metal thus forming a first via-contact layer electrically connecting said first conductor layer with said second conductor layer;

performing a patterning of said first conductor layer to form a first wiring pattern in said first conductor layer;

laminating a second film having a first insulating layer and a third conductor layer formed on said first insulating layer on said one surface of said first film in such a manner that said first insulating layer is in contact with said one surface of said first film;

forming a second via-contact hole in a second film, by using a laser beam, said second via-contact hole passing through the third conductor layer and first insulating film and reaching the first wiring pattern;

performing an electrolytic plating to bury the second via-contact hole with a metal thus forming a second via-contact layer electrically connecting said first wiring pattern with said third conductor layer;

performing a patterning of said third conductor layer to form a second wiring pattern in said third conductor layer;

laminating a third film having a second insulating layer and a fourth conductor layer formed on said second insulating layer on the other surface of said first film in such a manner that said second insulating layer is in contact with said other surface of said first film;

forming a third via-contact hole in a third film, by using a laser beam, said third via-contact hole passing through the fourth conductor layer and second insulating film and reaching the second wiring pattern;

performing an electrolytic plating to bury the third via-contact hole with a metal thus forming a third via-contact layer electrically connecting said second wiring pattern with fourth conductor layer;

performing a patterning of said fourth conductor layer to form a third wiring pattern in said fourth conductor layer; and performing a patterning of said second conductor layer to form a fourth wiring pattern in said second conductor layer.

* * * * *

UNITED STATES PATENT AND TRADEMARK OFFICE
CERTIFICATE OF CORRECTION

| | | |
|---|---|---|
| PATENT NO. | : 7,584,535 B2 | Page 1 of 1 |
| APPLICATION NO. | : 11/727630 | |
| DATED | : September 8, 2009 | |
| INVENTOR(S) | : Takehito Tsukamoto et al. | |

It is certified that error appears in the above-identified patent and that said Letters Patent is hereby corrected as shown below:

Column 1, Line 8, change "abadoned." to --abandoned.--.

Column 34, Line 60, change "Insulating" to --insulating--.

Signed and Sealed this

Fifth Day of January, 2010

David J. Kappos
*Director of the United States Patent and Trademark Office*